(12) United States Patent
Danesh et al.

(10) Patent No.: US 9,151,818 B2
(45) Date of Patent: Oct. 6, 2015

(54) VOLTAGE MEASUREMENT

(71) Applicant: Analog Devices Global, Hamilton (BM)

(72) Inventors: Seyed Amir Ali Danesh, Edinburgh (GB); Jonathan Ephraim David Hurwitz, Edinburgh (GB)

(73) Assignee: Analog Devices Global (BM)

( * ) Notice: Subject to any disclaimer, the term of this patent is extended or adjusted under 35 U.S.C. 154(b) by 217 days.

(21) Appl. No.: 13/672,236

(22) Filed: Nov. 8, 2012

(65) Prior Publication Data

US 2013/0113507 A1 May 9, 2013

Related U.S. Application Data

(60) Provisional application No. 61/557,369, filed on Nov. 8, 2011.

(51) Int. Cl.
*G01R 27/08* (2006.01)
*G01R 19/00* (2006.01)
(Continued)

(52) U.S. Cl.
CPC ............... *G01R 35/04* (2013.01); *G01R 15/04* (2013.01); *G01R 19/0084* (2013.01); *G01R 21/133* (2013.01); *G01R 21/14* (2013.01); *G01R 19/02* (2013.01)

(58) Field of Classification Search
CPC ........ G01R 27/02; G01R 27/16; G01R 27/26; G01R 27/28; G01R 19/0084; G01R 19/0092
USPC ......... 324/713, 691, 649, 600, 522, 98, 76.11
See application file for complete search history.

(56) References Cited

U.S. PATENT DOCUMENTS 4,210,875 A * 7/1980 Beasom ..................... 330/261
4,293,782 A * 10/1981 Tanaka et al. ................ 327/97
(Continued)

FOREIGN PATENT DOCUMENTS

DE     10310503      9/2004
DE   102010052346    5/2012
(Continued)

OTHER PUBLICATIONS

Ziegler et al., Current Sensing Techniques: A Review, IEEE Sensors Journal, vol. 9, No. 4, Apr. 2009, pp. 354-376.
(Continued)

*Primary Examiner* — Hoai-An D Nguyen
(74) *Attorney, Agent, or Firm* — Schwegman Lundberg & Woessner, P.A.

(57) ABSTRACT

A voltage measurement apparatus is provided that includes: a potential attenuator configured to be electrically connected between first and second conductors, which are electrically coupled to a source, wherein the potential attenuator includes a first impedance and a reference impedance arrangement in series with each other, wherein the reference impedance arrangement has an electrical characteristic that can be changed in a known fashion; and further including a processing arrangement configured to acquire at least one signal from the reference impedance arrangement, the at least one signal reflecting change of the electrical characteristic in the known fashion; and to determine a voltage between the first and second conductors in dependence on the fashion in which the electrical characteristic is changed being known and the at least one signal.

14 Claims, 11 Drawing Sheets

(51) Int. Cl.
*G01R 35/04* (2006.01)
*G01R 21/133* (2006.01)
*G01R 21/14* (2006.01)
*G01R 15/04* (2006.01)
*G01R 19/02* (2006.01)

(56) References Cited

U.S. PATENT DOCUMENTS

| | | | |
|---|---|---|---|
| 5,115,200 A * | 5/1992 | Lahitte et al. | 324/718 |
| 5,386,188 A | 1/1995 | Minneman et al. | |
| 5,512,837 A * | 4/1996 | Ohnishi | 324/704 |
| 5,804,979 A | 9/1998 | Lund et al. | |
| 6,522,123 B2 | 2/2003 | Ribes | |
| 6,654,219 B1 | 11/2003 | Romano et al. | |
| 7,298,135 B2 | 11/2007 | Briese et al. | |
| 8,450,995 B2 | 5/2013 | Wagner | |
| 2002/0153901 A1 | 10/2002 | Davis et al. | |
| 2004/0061506 A1 | 4/2004 | Rupp | |
| 2005/0237047 A1 * | 10/2005 | Voisine | 324/76.11 |
| 2006/0167642 A1 * | 7/2006 | Ferrer et al. | 702/79 |
| 2009/0121729 A1 | 5/2009 | Farkas | |
| 2009/0267582 A1 | 10/2009 | Prodic et al. | |
| 2010/0225304 A1 | 9/2010 | Wynne | |
| 2014/0253102 A1 | 9/2014 | Wood et al. | |

FOREIGN PATENT DOCUMENTS

| | | |
|---|---|---|
| EP | 1278073 | 1/2003 |
| GB | 2006443 | 5/1979 |
| GB | 2224853 | 5/1990 |
| GB | 2424286 | 7/2009 |
| WO | 99/67653 | 12/1999 |
| WO | 2006002446 | 1/2006 |
| WO | WO-2014/072733 A2 | 5/2014 |

OTHER PUBLICATIONS

"International Application Serial No. PCT/GB2013/052947, International Search Report mailed Mar. 13, 2014 ", 3 pgs.

* cited by examiner

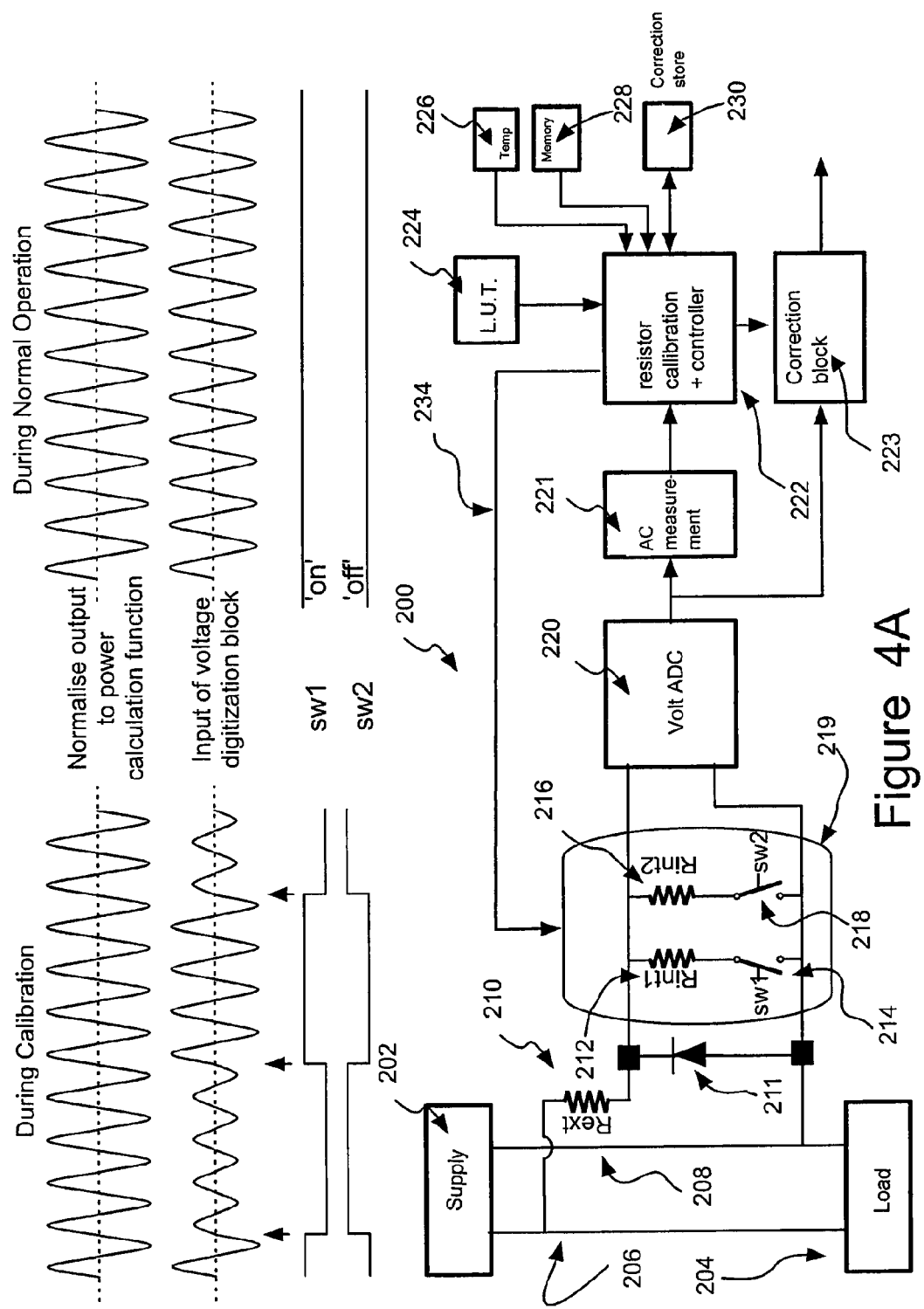

VOLTAGE MEASUREMENT

CROSS REFERENCE TO RELATED APPLICATION

This application claims priority to U.S. Provisional Application No. 61/557,369, filed on Nov. 8, 2011, which is incorporated herein by reference in its entirety as if fully set forth herein.

FIELD OF THE INVENTION

The present invention relates to voltage measurement apparatus and methods of measuring voltage, in particular but not exclusively for measuring line voltage in the like of electricity consumption circuits and electricity generation circuits. The present invention further relates to apparatus, such as electricity generation, transmission, distribution or consumption apparatus, which comprises such voltage measurement apparatus or is operative to measure voltage according to such methods. In particular but not exclusively current is measured in conjunction with voltage to provide for determination of at least one power metric.

BACKGROUND ART

Electromechanical meters have been long used to measure electricity consumed by residences, businesses and electrically powered systems. The most commonly used type of electromechanical meter is the induction watt-hour meter. The induction watt-hour meter comprises a rotatable metallic disc which rotates at a speed proportional to power consumption and thereby provides a measure of electricity consumption. The rotatable metallic disc is actuated by two coils: a first coil which is disposed in series with the current delivering conductors such that the coil produces a magnetic flux proportional to the current delivered; and a second coil which is disposed in parallel with the conductors over which the current is delivered such that the coil produces a magnetic flux proportional to the line voltage. A lag coil is used to delay the field of the second, line voltage measuring coil by ninety degrees whereby power measurement is based on the product of in phase current and line voltage signals.

More recently electronic meters have been introduced. Such electronic meters make use of advances in electronic technology by displaying electricity consumption on an LCD or LED display and providing for transmission of measurements to remote locations. Such electronic meters also provide for more sophisticated or extensive forms of measurement including the like of maximum demand, power factor, reactive power used and consumption during on-peak and off-peak hours. As the line voltage is often many times larger than the largest signal that can be safely or conveniently measured by the low voltage circuitry in electronic meters, a resistive potential divider is the most commonly employed means of sensing the line voltage. The resistive potential divider is disposed in parallel with the current delivering conductors and is operative to lower the voltage to be measured by the factor of the potential divider ratio. The potential divider ratio can be quite large. For example a potential divider ratio of approximately 2000:1 is required to reduce a 240V+/−20% RMS mains voltage to a signal that is <0.5V peak-peak in the worst case, which is the voltage that can be typically handled by a ground referenced divider without distortion arising from protection structures that may be present on the input of the voltage measurement chain.

Certain applications, such as metering of electricity consumption and generation, require measurement to high accuracy over extended periods of time. For example in North America the ANSI C12.20 standard specifies an accuracy of ±0.5% for Class 0.5 consumption meters and ±0.2% for Class 0.2 consumption meters. Standards applicable in Europe and elsewhere, such as IEC 62053, specify similar accuracy requirements. The potential divider ratio and the accuracy of the subsequent voltage measurement chain therefore needs to be known and of sufficient stability to meet the accuracy requirements of the power measurement application. Accurate line voltage measurement normally depends on the use of components with good temperature coefficients and known values. A lack of accuracy in the potential divider ratio or an error in the transfer function of the voltage measurement chain gain will cause an error in line voltage measurement. It is normal for this reason to perform a one-off factory calibration when the potential divider and the readout electronics are combined so that a factor related to the actual combined transfer function for line voltage to measurement value, which is determined largely by the potential divider and voltage measurement circuitry, can be stored and used in subsequent measurements to achieve the desired accuracy.

The components that make up the potential divider and the voltage measurement chain are required not to change significantly over the operating lifetime and the environmental conditions if there is to be no degradation in use that takes the measurement apparatus outside its targeted accuracy. The components used in the potential divider may be subject to various external stresses due to the like of ESD, surge and overvoltage conditions and may dissipate different wattages in normal operation. External stresses and dissipation of different wattages can lead to a change in potential divider ratio. It is therefore normal to use highly specified components in this application.

Potential dividers are also used in DC applications for voltage measurement where the voltage to be measured is outside the range that can be safely or conveniently handled by the voltage measurement chain voltage range. By way of example DC voltage measurement may be employed in battery monitoring.

High accuracy power calculation also requires accurate and stable relative phase and frequency response of the line voltage and current measurements in order to accurately determine the like of active and reactive power, differences between active and reactive power, power factor and harmonic content.

The present inventors have become appreciative of various shortcomings of known approaches to line voltage measurement and power measurement, such as the approaches described in outline in the preceding paragraphs. It is therefore an object for the present invention to provide improved voltage measurement apparatus which is configured to provide for accurate measurement of voltage, for example of line voltage in a circuit carrying mains current. It is another object for the present invention to provide an improved method of measuring voltage which provides for accurate measurement of voltage, for example of line voltage in a circuit carrying mains current. It is a further object for the present invention to provide power measurement apparatus which comprises improved line voltage measurement apparatus, whereby accurate power measurement may be achieved. It is a yet further object for the present invention to provide an improved method of measuring power which provides for improved measurement of line voltage, whereby accurate power measurement may be achieved.

SUMMARY OF INVENTION

The present invention has been devised in the light of the inventors' appreciation of the shortcomings of known approaches to voltage measurement. Therefore and according to a first aspect of the present invention there is provided voltage measurement apparatus comprising:

- a potential attenuator configured to be electrically connected between first and second conductors, the first and second conductors being electrically coupled to a source, the potential attenuator comprising: a first impedance and a reference impedance arrangement in series with each other, the reference impedance arrangement having an electrical characteristic which is changed in a known fashion; and
- a processing arrangement configured: to acquire at least one signal from the reference impedance arrangement, the at least one signal reflecting change of the electrical characteristic in the known fashion; and to determine a voltage between the first and second conductors in dependence on the fashion in which the electrical characteristic is changed being known and the at least one signal.

Accurate measurement of voltage, such as of line voltage for the purpose of measurement of power consumption, may be achieved by connecting the potential attenuator between first and second conductors which are electrically coupled to a source. The first and second conductors may, for example, be a live conductor and a neutral conductor operative at mains voltage. The potential attenuator comprises a first impedance and a reference impedance arrangement. The potential attenuator may be electrically coupled to the processing arrangement. The processing arrangement may comprise a voltage measuring arrangement. The voltage measuring arrangement may be configured to measure at least one signal from the reference impedance arrangement, for example a voltage signal developed across a component such as a resistor of the reference impedance arrangement, with the at least one signal reflecting a change of an electrical characteristic of the reference impedance arrangement in a known fashion. Where the voltage measuring arrangement is operative at low voltage levels, e.g. if the voltage measuring arrangement is comprised in an integrated circuit, it may be desirable to reduce the level of measured voltage to correspond to an operating voltage of the voltage measuring arrangement. Therefore the first impedance may be of much greater impedance than an impedance of the reference impedance arrangement when the electrical characteristic changes in the known fashion. The fashion in which the electrical characteristic changes may be known in respect of a profile of the change in the electrical characteristic. For example the change may comprise a step profile between two values, a staircase profile over plural values or an analogue profile between two values, such as a sine wave profile. According to one example the first impedance may have a resistance of 10 MΩ and a resistance of the reference impedance arrangement may be 5 kΩ. An impedance of the reference impedance arrangement may be predetermined, e.g. by selection of at least one component of the reference impedance arrangement, such that the impedance value corresponds to a particular value to a desired level of accuracy. Alternatively or in addition an impedance value of the reference impedance arrangement may be determined, e.g. by a measurement procedure involving a calibration standard, such that the impedance value is known to a desired level of accuracy. Alternatively or in addition an extent to which the electrical characteristic of the reference impedance arrangement changes may be predetermined or measured. For example and where the electrical characteristic changes between two states, the ratio of a resistance of the reference impedance arrangement in the two states may be predetermined or measured.

Acquisition by the processing arrangement of at least one signal from the reference impedance arrangement with the at least one signal reflecting change of the electrical characteristic in the known fashion provides for determination of the voltage between the first and second conductors. More specifically determination of the voltage between the first and second conductors is in dependence on the change in electrical characteristic being known in addition to the acquired at least one signal. The voltage between the first and second conductors is the primary unknown quantity which is determined by the voltage measurement apparatus of the present invention. In addition the impedance of the first impedance of the potential attenuator may be unknown, may be known to insufficient accuracy or may have drifted from a known value during use. As a result the attenuation factor, e.g. the potential divider ratio where the potential attenuator is a potential divider, provided by the first impedance and the reference impedance arrangement may be known to insufficient accuracy or may have drifted from a known value during use. Voltage measurement apparatus which is configured and operative according to the present invention may enable the impedance of the first impedance of the potential attenuator to be determined to required accuracy. Alternatively or in addition voltage measurement apparatus, which is configured and operative according to the present invention, may be operative to determine the attenuation factor at least one of before and after a change in the electrical characteristic. More specifically changing the electrical characteristic of the reference impedance arrangement in effect provides at least two circuit equations in a corresponding number of unknowns. For example changing the electrical characteristic of the reference impedance arrangement between two states provides two circuit equations in two unknowns, i.e. the voltage between the first and second conductors and the impedance of the first impedance, with the two equations being solvable for one of the unknowns, i.e. the voltage between the first and second conductors or the impedance of the first impedance. The two circuit equations may comprise as known: an impedance of the reference impedance arrangement when in the two states; and a first signal as acquired by the processing arrangement when in one state and a second signal as acquired by the processing arrangement when in the other state. The voltage measurement apparatus may therefore rely for accuracy of determination of the voltage between the first and second conductors on an impedance of the reference impedance arrangement being known to a desired accuracy whilst the electrical characteristic changes and on accuracy of measurement of the at least one signal. Alternatively or in addition an extent of change in the impedance of the reference impedance arrangement as the electrical characteristic changes, such as a ratio where the electrical characteristic changes between two states, may be known to sufficient accuracy and be used to determine the voltage between the first and second conductors without knowledge of the absolute value of impedance of the reference impedance arrangement. Such an approach in effect involves solving three unknowns by way of three circuit equations. The processing arrangement may be further operative to determine the attenuation factor.

The processing arrangement may be configured to determine an impedance of the first impedance in dependence on the fashion in which electrical characteristic is changed being known and the at least one signal. The processing arrangement may be further configured to determine an attenuation factor in dependence on the determined impedance of the first impedance. The determined attenuation factor may be stored, e.g. in a data store comprised in the voltage measurement apparatus. The processing arrangement may be further configured to determine the voltage between the first and second conductors by applying the attenuation factor to a signal acquired by the processing arrangement when, for example, the electrical characteristic is unchanging.

The processing arrangement may be configured to compare a change in impedance of the first impedance from one determination to another with a threshold value. The processing arrangement may be further configured to make a determination with regards to a fault condition in dependence on the comparison. More specifically the processing arrangement may be operative to indicate a fault condition where the impedance change exceeds the threshold value. Alternatively or in addition the processing arrangement may be configured to compare a rate of change of impedance determined for the first impedance with a threshold value. The processing arrangement may be further configured to make a determination with regards to a fault condition in dependence on the comparison. More specifically the processing arrangement may be operative to indicate an impending failure of the potential attenuator where the rate of impedance change exceeds the threshold value.

The reference impedance arrangement may be changeable between a first configuration having a known electrical characteristic and a second configuration having a known electrical characteristic and the processing arrangement may be configured to: to acquire at least one first signal from the reference impedance arrangement when in the first configuration; to acquire at least one second signal from the reference impedance arrangement when in the second configuration; to determine a voltage between the first and second conductors in dependence on the known electrical characteristics of the reference impedance arrangement when in the first and second configurations, the at least one first signal and the at least one second signal. The reference impedance arrangement may therefore change between two states with a signal being acquired from the reference impedance arrangement when in each of the two states. The voltage measurement apparatus may be configured such that the processing arrangement is operative to acquire the at least one first and second signals from a component, such as a resistor, comprised in the reference impedance arrangement.

The reference impedance arrangement may be operative to switch periodically between first and second configurations and the processing arrangement may be operative to determine an attenuation factor when in each configuration. The processing arrangement may be further operative to determine a voltage between the first and second conductors when the reference impedance arrangement is in one of the first and second configurations. The processing arrangement may make the voltage determination intermittently in dependence on previously determined and stored values. Periodic switching between the first and second configurations may be at a higher or lower frequency than a fundamental frequency of the voltage between the first and second conductor, e.g. 50 or 60 Hz in an AC mains voltage measuring application. The switching frequency may be locked to the fundamental frequency and may perhaps be between harmonics or be at a sub-harmonic frequency. The voltage measurement apparatus may be operative to switch between the first and second configurations when required to determine or track changes in the attenuation factor to thereby maintain the desired accuracy. The processing arrangement may be operative to make selective use of the at least one first and second signals to mitigate effects of the voltage between the first and second conductors changing between the reference impedance arrangement being in the first configuration and being in the second configuration. For example the processing arrangement may be operative to discard or filter first and second signals in certain phases of the fundamental frequency of the voltage between the first and second conductors to reduce the effects of noise on the signal which may otherwise alter the accuracy of measurement.

Effectively, changing the reference impedance arrangement between the first and second configurations involves modulation of the potential attenuator such that a signal is developed across the first impedance in dependence of the unknown voltage between the first and second conductors and the known change in the electrical characteristic of the reference impedance arrangement. According to an alternative explanation the reference impedance arrangement is operative to provide a first current signal in the potential attenuator when in the first configuration and a second current signal in the potential attenuator when in the second configuration with the first and second current signals comprising components of different amplitudes. The reference impedance arrangement may be configured, for example, to change the RMS current in the potential attenuator by 0.1% between the first and second configurations.

An impedance of the reference impedance arrangement may be substantially different between the first configuration and the second configuration. For example the impedance of the reference impedance arrangement may be 5 k$\Omega$ in the first configuration and 2.5 k$\Omega$ in the second configuration such that relative to a nominal 10 M$\Omega$ first impedance there is a change of 0.025% in the total impedance between the first and second conductors with corresponding effect on the rms current in the potential attenuator.

A potential attenuator between two conductors can be formed, amongst other ways, by two different approaches. One approach is to form a potential divider with two passive impedances connected in series between the conductors. The other approach is to configure an active component, such as an amplifier, such that one passive impedance in series with one conductor is feeding the virtual earth of the amplifier relative to the other conductor and the other passive impedance is present in the feedback path of the amplifier so as to make an inverting amplifier configuration. The two approaches can be made functionally equivalent by appropriate choices of components.

In a first embodiment the potential attenuator may be configured such that the reference impedance arrangement may have a first reference impedance value when in the first configuration and a second reference impedance value when in the second configuration. The potential attenuator may therefore and according to the first approach have the form of a potential divider. The known electrical characteristic of the first configuration may therefore comprise the first reference impedance value and the known electrical characteristic of the second configuration may therefore comprise the second reference impedance value. The processor arrangement may therefore determine the voltage between the first and second conductors in dependence on the first and second reference impedance values. The changing between the first and second reference impedance values in effect provides two circuit equations in two unknowns as described in more detail above.

The reference impedance arrangement may comprise a second impedance, such as a resistor, in parallel with a third impedance, such as a resistor, and at least one switch operative to connect and disconnect at least one of the second and third impedances. More specifically the reference impedance arrangement may comprise a first switch operative to connect and disconnect the second impedance and a second switch operative to connect and disconnect the third impedance. The voltage measurement apparatus may be configured such that the second impedance is connected and the third impedance disconnected when in the first configuration and such that the third impedance is connected and the second impedance disconnected when in the second configuration. The first and second switches may be operative out of phase with each other.

The accuracy of determination of the voltage between the first and second conductors and the accuracy of determination of the potential divider ratio and/or the value of the first impedance as a function of the measurement accuracy of the first and second signals, the known accuracy of the first and second configurations of the reference impedance arrangement and/or the known accuracy of the ratio of impedances between first and second configurations, is sensitised by the size of the potential divider ratio. For example a divider ratio of 1000:1 requires higher accuracy than a divider ratio of 100:1 to achieve the same overall desired accuracy of voltage measurement.

The maximum signal that can be handled at the input of the processing arrangement may determine the minimum required divider ratio. The maximum signal may be often limited by one of the parasitic diodes and the protection structures that are often present in the active components of the discrete or integrated circuits that may form part of the reference impedance arrangement and/or the processing arrangement. This is because it is normally undesirable to have these components take some of the current that should be present in the potential divider as may happen if the voltage swing is too large. One way to reduce the required divider ratio is to allow the voltage at the input of the processing arrangement to make a larger swing without turning these components on by applying an offset voltage to the divider with respect to the second conductor.

The voltage measurement apparatus may be configured to apply an offset voltage between the first and second conductors. More specifically the voltage measurement apparatus may be configured to apply the offset voltage between the first impedance and one of the first and second conductors. The voltage measurement apparatus may therefore further comprise an offset voltage circuit which is operative to apply at least one offset voltage, such as of 1 volt, between the first and second conductors. The offset voltage circuit may be comprised in the reference impedance arrangement. The application of an offset voltage may allow for the use of a lower ratio between the first impedance and the impedance of the reference impedance arrangement so that a larger voltage swing can be accommodated by the processing arrangement to provide for more accurate measurement. The offset voltage may address clipping in measurement caused by the turning on of protection circuitry provided at inputs to the voltage measurement apparatus. The processing arrangement may further comprise an offset voltage compensation circuit which is operative to apply a compensation signal to an acquired signal to cancel the effect of the offset voltage applied before acquisition.

The voltage measurement apparatus may be configured to alter the current in the potential attenuator between the first and second configurations. In such a configuration an impedance of the reference impedance arrangement may be substantially the same when the reference impedance arrangement is in the first and second configurations. Therefore a signal developed across the first impedance as a function of a known change in an electrical characteristic of the reference impedance arrangement may change between the first and second configurations. The at least one first signal and the at least one second signal may therefore be developed in an impedance of substantially the same value. The impedance in which the least one first signal is developed and the impedance in which the least one second signal is developed may be the same component. Accordingly the reference impedance arrangement may be configured such that the known electrical characteristic in each of the first and second configurations is other than an impedance of the reference impedance arrangement.

In a second embodiment the potential attenuator may be configured such that the reference impedance arrangement is operative to apply at least one offset voltage between the first and second conductors to thereby change between the first and second configurations. The application of at least one offset voltage in effect provides for a change in current in the potential attenuator between the two configurations and therefore a change in voltage developed across the first impedance. Where, for example, at least one first and second signals associated with the first and second configurations of the reference impedance arrangements are acquired two circuit equations in two unknowns may then be solved as is described in more detail above. At least one of the voltage between the first conductor and second conductor, the value of the first impedance and the attenuation factor formed by the first impedance and the reference impedance in at least one of the first and second configurations may then be determined.

The potential attenuator may comprise a second impedance in series with the first impedance. The reference impedance arrangement may be operative to apply at least one offset voltage between the second impedance and one of the first and second conductors. In one form, the reference impedance arrangement is operative to apply no offset when in the first configuration and to apply an offset, such as of 1 volt, when in the second configuration. In another form, the reference impedance arrangement is operative to apply a first offset, such as of 0.5 volts, when in the first configuration and to apply a second offset, such as of 1.5 volts, when in the second configuration. The application of the first and second offsets may address the clipping in measurement caused by the turning on of protection circuitry as described in more detail above. The potential attenuator may comprise an offset voltage circuit which is operative to apply at least one offset voltage between the first and second conductors. The processing arrangement may comprise an offset voltage compensation circuit which is operative to apply at least one offset compensation signal to acquired signals to cancel the effect of the at least one offset voltage applied before acquisition.

The potential attenuator may further comprise a switch arrangement in series with the second impedance, the switch arrangement being operative to apply the at least one offset voltage. Alternatively or in addition the potential attenuator may further comprise a signal generator in series with the second impedance, the signal generator being operative to apply the at least one offset voltage. Alternatively or in addition the potential attenuator may further comprise an active circuit arrangement electrically coupled to the first and second impedances so as to form an attenuator and perhaps an inverting attenuator. A gain of the attenuator may be determined by the ratio of the first and second impedances. The active circuit arrangement may comprise an operational amplifier such that the potential attenuator is configured according to the second approach mentioned above. The potential attenuator may further comprise a signal generator in series between the active circuit arrangement and one of the first and second conductors.

The potential attenuator may be configured such that the reference impedance arrangement is operative to apply plural offset voltages between the first and second conductors. The plural offset voltages may define a waveform of discrete form, such as a staircase, or a waveform of continuous form, such as a ramp or at least a part of a sinusoid. Where the waveform is of continuous form, the waveform may comprise plural signals of different frequencies. An offset voltage circuit which is operative to apply plural offset voltages may comprise a signal generator. The signal generator may be configured to generate an offset voltage of predetermined form, such as of discrete or continuous form.

The processing arrangement may be configured to extract modulation from an acquired signal, the modulation arising, for example, from changing between the first and second configurations. The processing arrangement may therefore comprise a modulation extraction circuit which provides an output signal from which modulation is removed. The modulation extraction circuit may be operative on a digital form of an acquired signal. Alternatively or in addition the modulation extraction circuit may be operative on a signal acquired from the offset voltage circuit. More specifically the voltage measurement apparatus may be configured to measure current in the offset voltage circuit and the modulation extraction circuit may be operative on the measured current. The modulation extraction circuit may be operative on the basis of at least one of frequency analysis and time domain analysis. The processing arrangement may be operative to determine the impedance of the first impedance in dependence on an acquired signal comprising modulation and an acquired signal from which modulation has been extracted.

Voltage measurement apparatus according to the present invention may comprise the first and second embodiments. More specifically the voltage measurement apparatus may be configured to selectively operate in accordance with one, other or both of the first and second embodiments.

Plural signal acquisitions may be made and one or more of various computations may be carried out in dependence on the signal acquisitions to, for example, take account of an alternating current signal being drawn from the source or to address noise. Therefore the impedance of the first impedance may be determined in dependence on at least one of plural first signal acquisitions and plural second signal acquisitions. The plural signals may be acquired over plural cycles of an alternating voltage signal between the first and second conductors. The processing arrangement may therefore be operative to reduce error inducing effects, such as impulsive noise. Alternatively or in addition the impedance of the first impedance may be determined in dependence on at least one of plural first signal acquisitions and plural second signal acquisitions within a cycle of an alternating voltage signal between the first and second conductors. More specifically the voltage measurement apparatus may be operative to determine in dependence on the plural signal acquisitions at least one of: an RMS voltage value for the alternating voltage signal; and a peak voltage value for the alternating voltage signal, such as an average peak voltage value.

Where an alternating voltage signal is present between the first and second conductors, the voltage measurement apparatus may be operative to change between the first and second configurations at a frequency lower than the frequency of the alternating voltage signal. The voltage measurement apparatus may be operative to change between the first and second configurations at or at least proximate a zero crossing of an alternating voltage signal present between the first and second conductors. Changing between the first and second configurations at or at least proximate the zero crossing may minimise errors in determination of the impedance of the first impedance. The voltage measurement apparatus may be operative to determine the zero crossing in dependence on plural signals acquired during a cycle of the alternating voltage signal. Alternatively or in addition, the voltage measurement apparatus may be operative to change between the first and second configurations at a frequency higher than the frequency of the alternating voltage signal. The frequency of change between the first and second configurations may be between harmonics of the fundamental frequency in the alternating voltage signal so as to improve the ability to extract the modulation. Processing by the processor arrangement in respect of the at least one first and second signals may be over periods that are a multiple of the period of the fundamental frequency of the alternating voltage signal to provide for approximately even effect of the alternating voltage signal on both of the at least one first and second signals.

The voltage measurement apparatus may be operative to change between the first and second configurations at spaced apart times and the processing arrangement may be operative to acquire at least one signal at such spaced apart times. Thus the voltage measurement apparatus may be operative substantially with the reference impedance arrangement in the first configuration. The reference impedance arrangement may be changed from the first configuration to the second configuration at predetermined times, e.g. on a daily or weekly basis. Alternatively or in addition the reference impedance arrangement may be changed from the first configuration to the second configuration in dependence on receipt of a control signal. The reference impedance arrangement may be formed as part of a circuit such as an integrated circuit, e.g. with the processing arrangement. The first impedance may be a component external to a circuit comprising the reference impedance arrangement.

The processing arrangement may comprise a voltage measuring arrangement. The voltage measuring arrangement may comprise acquisition circuitry operative to acquire the at least one first signal and the at least one second signal developed in an impedance of the reference impedance arrangement. The acquisition circuitry may be operative to sample the at least one first signal and the at least one second signal and to convert sampled signals to digital form, such as by way of an analogue to digital converter. The processing arrangement may comprise a computation arrangement which may, for example, be operative to calculate a line voltage value in dependence on acquired voltage signals amongst other things. The processing arrangement may comprise data storage which is, for example, operative to store intermediate data used during computations or data used for diagnostic purposes. The processing arrangement may be operative to recover a previously determined attenuation factor from data storage and to calculate the present line voltage signal while at the same time determining an updated potential attenuation factor.

The voltage measurement apparatus may further comprise a temperature sensor and may be operative, e.g. by way of a data store comprised in the voltage measurement apparatus, to store at least one temperature profile. The at least one temperature profile may, for example, be stored in the form of a look up table. The voltage measurement apparatus may be operative to compensate for temperature change in dependence on an output from the temperature sensor and the at least one temperature profile. More specifically the processing arrangement may be operative to change at least one of a determined voltage between the first and second conductors and a determined impedance for the first impedance to thereby compensate for temperature change.

The first and second conductors may electrically couple a load to the source. The voltage measurement apparatus may further comprise the first and second conductors, such as a live and neutral conductor of a mains circuit. The voltage measurement apparatus may further comprise at least one of the supply and the load. As mentioned above the voltage measurement apparatus may be operative with alternating current signals. The voltage measurement apparatus may also be operative with direct current signals. The source may therefore comprise a direct current source to which the first and second conductors may electrically couple. Furthermore the voltage measurement apparatus may be configured to be operative in low current applications as well as in high current applications.

In the voltage measurement apparatus described above, a voltage signal between the first and second conductors that changes in the same fashion as the electrical characteristic of the reference impedance arrangement may alter the accuracy with which at least one of the line voltage, the first impedance and the attenuation factor (e.g. potential divider ratio) can be ascertained. This problem may be addressed by using more than one potential attenuator.

The voltage measurement apparatus may further comprise a second potential attenuator configured to be electrically connected between the first and second conductors. The second potential attenuator may comprise: a first impedance and a reference impedance arrangement in series with each other. The reference impedance arrangement may have electrical characteristic which is changeable in a known fashion. The processing arrangement may be configured: to acquire at least one signal from the reference impedance arrangement, the at least one signal reflecting change of the electrical characteristic in the known fashion; and to determine a voltage between the first and second conductors in dependence on the fashion in which the electrical characteristic is changed being known and the at least one signal. The second potential attenuator may therefore be operative in the same fashion as the first potential attenuator as described above. The reference impedance arrangement of the second potential attenuator may be configured in accordance with either the first or second embodiment described above. The reference impedance arrangement may therefore be configured to change its impedance, to apply an offset voltage or to apply a modulation signal. The voltage measurement apparatus may be configured such that the first and second potential attenuators are operative to change their electrical characteristic in different known fashions. For example the first and second potential attenuators may be operative to change between first and second configurations at different frequencies.

The processing arrangement may be operative to subtract signals acquired from one of the first and second potential attenuators from signals acquired from the other of the first and second potential attenuators. Subtraction may at least reduce if not remove noise common to the first and second potential attenuators. Thereafter the processing arrangement may be operative to determine at least one of: an impedance of the first potential attenuator; an impedance of the second potential attenuator; and a voltage between the first and second conductors.

The processing apparatus may be operative to correlate signals acquired from the first and second potential attenuators with each other to thereby align the signals with each other. Correlation may be performed before signals are subtracted from each other.

The processing apparatus may comprise a second voltage measuring arrangement. The second voltage measuring arrangement may comprise acquisition circuitry operative to acquire at least one signal from the reference impedance arrangement of the second potential attenuator. In an alternative form at least a part of a voltage measuring arrangement comprised in the processing apparatus may be operative in respect of both the first and second potential attenuators. The part of the voltage measuring arrangement may be operative on a time multiplexed basis. For example an analogue to digital converter of the voltage measuring arrangement may be operative on signals from both the first and second potential attenuators.

Determination of power consumption may require measurement of a current signal as well as a line voltage signal with power consumption being determined in dependence on measured current and line voltage signals. The voltage measurement apparatus may therefore further comprise current measurement apparatus configured, for example, to measure a current in a live or neutral conductor. The current measurement apparatus may comprise a measurement arrangement, such as a shunt resistor, configured to be disposed in relation to a load which draws a current signal, the measurement arrangement being operative when so disposed to measure the load drawn current signal. The voltage measurement apparatus may further comprise a multiplier arrangement operative to multiply measured voltage and current values to thereby determine instantaneous power. The voltage measurement apparatus may further comprise a real time clock and the voltage measurement apparatus may be operative in dependence on an output from the real time clock and the instantaneous power to determine the energy used. The present invention may be operative to generate relative phase characteristics of the current measurement and voltage measurement transfer functions to provide for alignment of current and voltage measurement values to correctly estimate instantaneous power and to calculate power quality metrics such as active power, reactive power and power factor.

A power generator, such as a renewable energy generator, may be present on the load side of the voltage measurement apparatus. The power generator may be operative to contribute to the power consumed by the load and thereby reduce the power drawn from the mains supply. Alternatively and in a local power generation scenario if no power is being consumed by the load or if the power generator is generating more power than is required by the load the power generator may be operative to convey power to the mains supply. Where the voltage measurement apparatus comprises current measurement apparatus and the current measurement apparatus comprises a measurement arrangement, the current measurement apparatus may be configured to provide for bidirectional current measurement. More specifically the current measurement apparatus may be configured: to acquire a voltage signal developed across the measurement arrangement, e.g. by way of a capacitive sample-and-hold arrangement comprised in the current measurement apparatus; and to determine a direction of power flow in relation to the load and a level of power conveyed. For example an instantaneous voltage acquired from across the measurement arrangement may be proportional to the sum of the load drawn current, the reference current and the negative of the generated current with a negative sum indicating power being conveyed to the supply.

Where electrical power is provided by a multi-phase mains electricity supply, according to a second aspect of the present invention there may be provided voltage measuring apparatus comprising plural voltage measurement apparatus according to the first aspect of the present invention, each of the plural voltage measurement apparatus being configured to measure line voltage between a different pair of wires of the electricity supply. For example the multi-phase mains electricity supply may be a split-phase supply, a three phase supply or even a supply with more than three phases.

Measurement of power consumption may depend on measurement of current in the live wires of each phase. Each voltage measurement apparatus may therefore comprise current measurement apparatus and a multiplier arrangement as described above, whereby each voltage measurement apparatus may be operative to determine an instantaneous power value for each of the phases. The voltage measuring apparatus may also comprise adding apparatus which is operative to add outputs from each of the plural voltage measurement apparatus to thereby provide a summed instantaneous power consumption value. The summed instantaneous power consumption value may be used for consumption monitoring purposes. The voltage measuring apparatus may further comprise a real time clock and may be operative upon summed instantaneous power consumption values in dependence on an output from the real time clock to provide an energy usage value. The voltage measuring apparatus may further comprise at least one galvanic isolator to maintain isolation between or amongst the supply conductors. The number of galvanic isolators required may depend on where the adding apparatus is disposed in the voltage measuring apparatus. For example and where the adding apparatus is constituted as a circuit element apart from all the voltage measurement apparatus a circuit path between each voltage measurement apparatus and the adding apparatus may comprise a galvanic isolator. Alternatively and where the adding apparatus is comprised in one of the voltage measurement apparatus a circuit path between each of the other voltage measurement apparatus may comprise a galvanic isolator. The voltage measuring apparatus may further comprise a further current measurement apparatus configured to measure current flowing in a neutral wire of the multi-phase supply. Further embodiments of the second aspect of the present invention may comprise one or more features of the first aspect of the present invention.

According to a third aspect of the present invention there is provided a method of measuring voltage by way of a potential attenuator electrically connected between first and second conductors which are electrically coupled to a source, the potential attenuator comprising a first impedance and a reference impedance arrangement in series with each other, the method comprising:

changing an electrical characteristic of the reference impedance arrangement in a known fashion;
acquiring at least one signal from the reference impedance arrangement, the at least one signal reflecting change of the electrical characteristic in the known fashion; and
determining a voltage between the first and second conductors in dependence on the fashion in which the electrical characteristic is changed being known and the at least one signal.

Embodiments of the third aspect of the present invention may comprise one or more features of the first or second aspect of the present invention.

According to a fourth aspect of the present invention there is provided electrical apparatus comprising voltage measurement apparatus according to the first aspect of the present invention or voltage measuring apparatus according to the second aspect of the present invention, the electrical apparatus being configured such that the voltage measurement apparatus or voltage measuring apparatus measures a line voltage in the electrical apparatus.

Alternatively or in addition the electrical apparatus may comprise electricity generation, transmission or distribution apparatus. The electrical apparatus may, for example, be constituted by an electricity meter or a distribution box with the voltage measurement apparatus being operative to a line voltage in the electricity meter or distribution box. The voltage measurement apparatus may thereby provide a means to measure the electricity consumed by a residence, business or electrically powered device or generated by generation apparatus, such as a solar panel based generator. Alternatively or in addition the electrical apparatus may comprise electrical propulsion apparatus comprising an electrical energy storage or generation device, such as a battery or fuel cell. The electrical propulsion apparatus may be configured such that the voltage measurement apparatus is operative to provide for regulation, e.g. by measurement of line voltage, of at least one of: power sourced by the electrical energy storage or generation device; and power sunk by the electrical energy storage device, e.g. during charging. Safe and reliable delivery of electrical power to electric motors at high current levels is normally required of such electrical propulsion apparatus. Accurate voltage measurement may therefore be required to provide for proper regulation and control and to monitor for fault conditions. Alternatively or in addition the electrical apparatus may comprise electrical control apparatus comprising an electrical actuator. The electrical control apparatus may be configured such that the voltage measurement apparatus is operative to measure line voltage provided by the electrical actuator. The electrical actuator may comprise a motor and the voltage measurement apparatus may be comprised in a motor controller which is operative to control the motor. Electrical control apparatus may be used in diverse fields, such as manufacturing, commercial machinery and process control. For example the electrical actuator may comprise a stepper motor forming part of a CNC machine or driving a valve in a fluid control system. Alternatively the electrical actuator may comprise a linear solenoid in an electrically controlled automotive transmission system. In such applications accurate measurement of voltage may provide for precision of control. Further embodiments of the fourth aspect of the present invention may comprise one or more features of any previous aspect of the present invention.

A previous aspect of the present invention may exclude an embodiment in which: the reference impedance arrangement is configured to change between a first condition in which the reference impedance arrangement has a first reference impedance value and a second condition in which the reference impedance arrangement has a second reference impedance value; and the voltage between the first and second conductors is determined in dependence on the first and second reference impedance values. A previous aspect of the present invention may exclude an embodiment comprising a potential divider as shown in FIG. 4A and as specifically described below but only in so far as the exclusion relates to the potential divider and operation of the processing chain in respect of this specifically shown and described potential divider.

BRIEF DESCRIPTION OF DRAWINGS

Further features and advantages of the present invention will become apparent from the following specific description, which is given by way of example only and with reference to the accompanying drawings, in which:

FIG. 4A shows voltage measurement apparatus according to a first embodiment;

DESCRIPTION OF EMBODIMENTS

Figure 1:
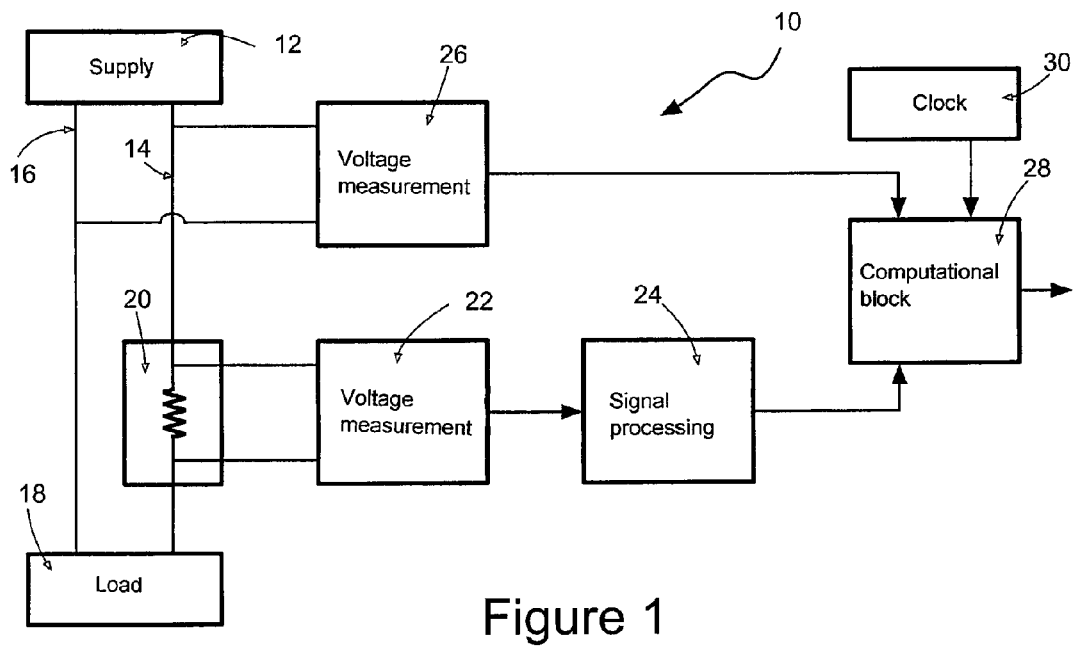
FIG. 1 is a block diagram representation of a first embodiment of power measurement apparatus according to the present invention.

A first embodiment of power measurement apparatus 10 is shown in FIG. 1. The power measurement apparatus 10 forms part of an electricity consumption meter (not shown) installed at a point of supply to residential or business premises. A single phase mains alternating current electricity source 12 with live 14 and neutral 16 supply wires are shown in FIG. 1. Energy consuming apparatus at the residential or business premises is represented by a load 18. The power measurement apparatus 10 comprises a shunt resistor 20 of known resistance in the live supply wire 14 in series with the load 18 between the load and the electricity supply 12. The shunt resistor 20 presents a low value of resistance, such as a resistance of 1 mΩ. The power measurement apparatus 10 further comprises voltage measuring apparatus 22, signal processing circuitry 24 and voltage measurement apparatus 26. The voltage measurement apparatus 26 is described in detail below with reference to FIGS. 4A to 5C. Inputs to the voltage measuring apparatus 22 are connected across the shunt resistor 20. An output from the voltage measuring apparatus 22 is received as an input by the signal processing circuitry 24. A first input to the voltage measurement apparatus 26 is electrically connected to the live supply wire 14 and a second input to the voltage measurement apparatus is electrically connected to the neutral supply wire 16. The power measurement apparatus 10 yet further comprises computational circuitry 28 and a real time clock 30. Although not shown in FIG. 1 the power measurement apparatus 10 comprises a noise filter at the input of each of the voltage measuring apparatus 22 and the voltage measurement apparatus 26 to suppress undesirable noise signals, such as impulse signals, which might otherwise be liable to disrupt operation of the power measurement apparatus.

Operation of the power measurement apparatus 10 of FIG. 1 will now be described. As a current signal is drawn by the load 18 through the shunt resistor 20 the voltage measuring apparatus 22 is operative to acquire by way of sample-and-hold and analogue to digital conversion circuitry a voltage signal developed across the shunt resistor 20 by the load drawn current and to generate a corresponding acquired voltage signal. The signal processing circuitry 24 is operative on the acquired voltage signal to effect whatever signal processing operations are required, such as digital filtering of the acquired voltage signal, and to determine the load drawn current on the basis of the acquired voltage signal and the known resistance of the shunt resistor 20. The voltage measurement apparatus 26 is operative to measure voltage across the live and neutral conductors 14, 16. The computational circuitry 28 is constituted by a microprocessor or the like and is operative to receive voltage measurements from the voltage measurement apparatus 26 and current measurements from the signal processing circuitry 24. The computational circuitry 28 is operative to determine instantaneous power by multiplication of line voltage and current measurements. Energy used is determined by integrating instantaneous power consumption over time in dependence on an output from the real time clock 30. The computational circuitry 28 is further operative to generate relative phase characteristics of the load current measurement transfer function with respect to the line voltage measurement to provide for alignment of load current and line voltage measurement values to correctly estimate instantaneous power and to calculate power quality metrics such as active and reactive power and power factor.

The power measurement apparatus 10 of FIG. 1 can be used in applications other than the measurement of power in mains electricity consumption meters. According to such other applications the shunt resistor 20 is present in a current carrying wire in series between a first node and a second node, with one of components 12 and 18 representing a voltage source, such as an electricity generator or energy storage device, and the other of components 12 and 18 representing an electrical load. In such other applications the voltage measurement apparatus 26 receives inputs from the conductors between components 12 and 18. Whichever of the components 12 and 18 represents the voltage source is immaterial to the capability of the current measurement apparatus to measure current passing through the shunt resistor 20 in either direction; this bidirectional metering capability is described further below with reference to FIG. 2. In one application component 12 represents a dc power source and component 18 represents a load. According to this application the load drawn current and the line voltage are dc signals. In a second application component 12 represents an ac power source and component 18 represents a load. According to this second application the load drawn current and the line voltage are ac signals. Measurement of current and voltage according to these applications provides for one or more of several purposes, such as regulation or monitoring, in diverse apparatus, such as energy generation, transmission or distribution apparatus, renewable energy generators, electrical propulsion apparatus and control apparatus.

Figure 2:
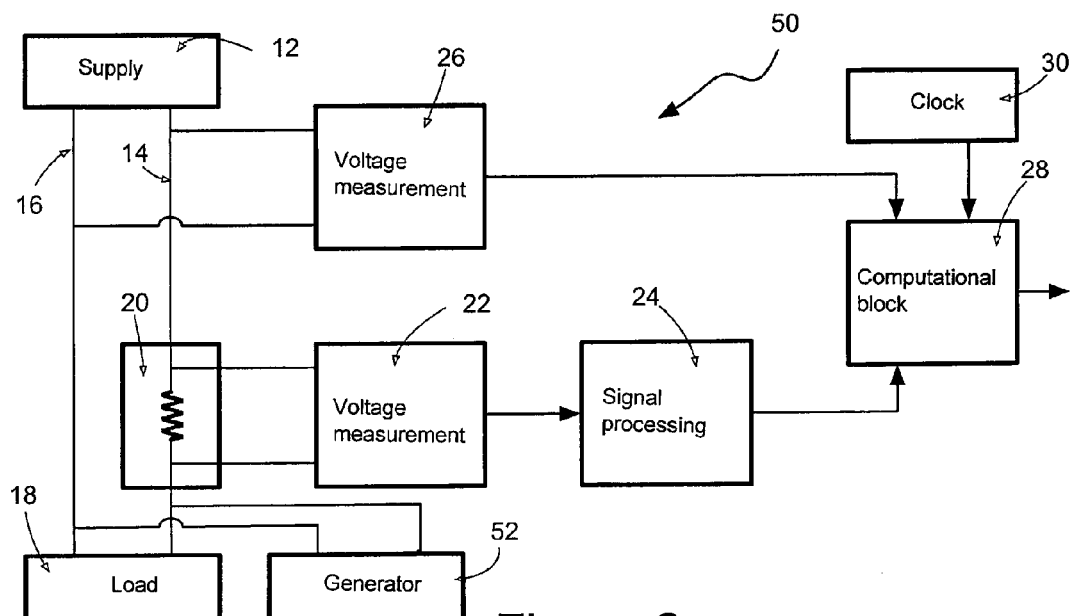
FIG. 2 is a block diagram representation of a second embodiment of power measurement apparatus according to the present invention.

FIG. 2 illustrates bidirectional metering in block diagram form. Components of the power measurement apparatus 50 of FIG. 2 in common with FIG. 1 are designated with like reference numbers and the reader's attention is directed to the description provided above with reference to FIG. 1 for a description of such common components. The power measurement apparatus 50 of FIG. 2 further comprises a generator 52, e.g. a renewable energy source such as an array of solar panels, which is located at the consumer's premises. When the generator 52 is operative to generate electricity, the load 18 draws less electricity from the mains electricity supply 12. In such circumstances the current passing through the shunt resistor 20 is the sum of the load drawn current, the reference input current and the negative of the current from the generator. At the time of acquisition of a voltage signal developed across the shunt resistor 20 the acquired sample is proportional to the sum of the currents. The demand from the load 18 may cease or drop to the extent that the generator 52 is generating electricity that is surplus to the load's requirements. Here the mains electricity supply is configured to receive the surplus electricity for onward transmission to the grid.

Therefore the sum of the currents is negative with the power measurement apparatus 50 being operative to measure the surplus electricity received by the mains electricity supply 12. Otherwise the power measurement apparatus 50 of FIG. 2 is operative in the same fashion as the power measurement apparatus 10 of FIG. 1, e.g. in respect of determining instantaneous power by multiplication of line voltage and current measurements and determining energy used by integrating instantaneous power consumption over time.

Figure 3:
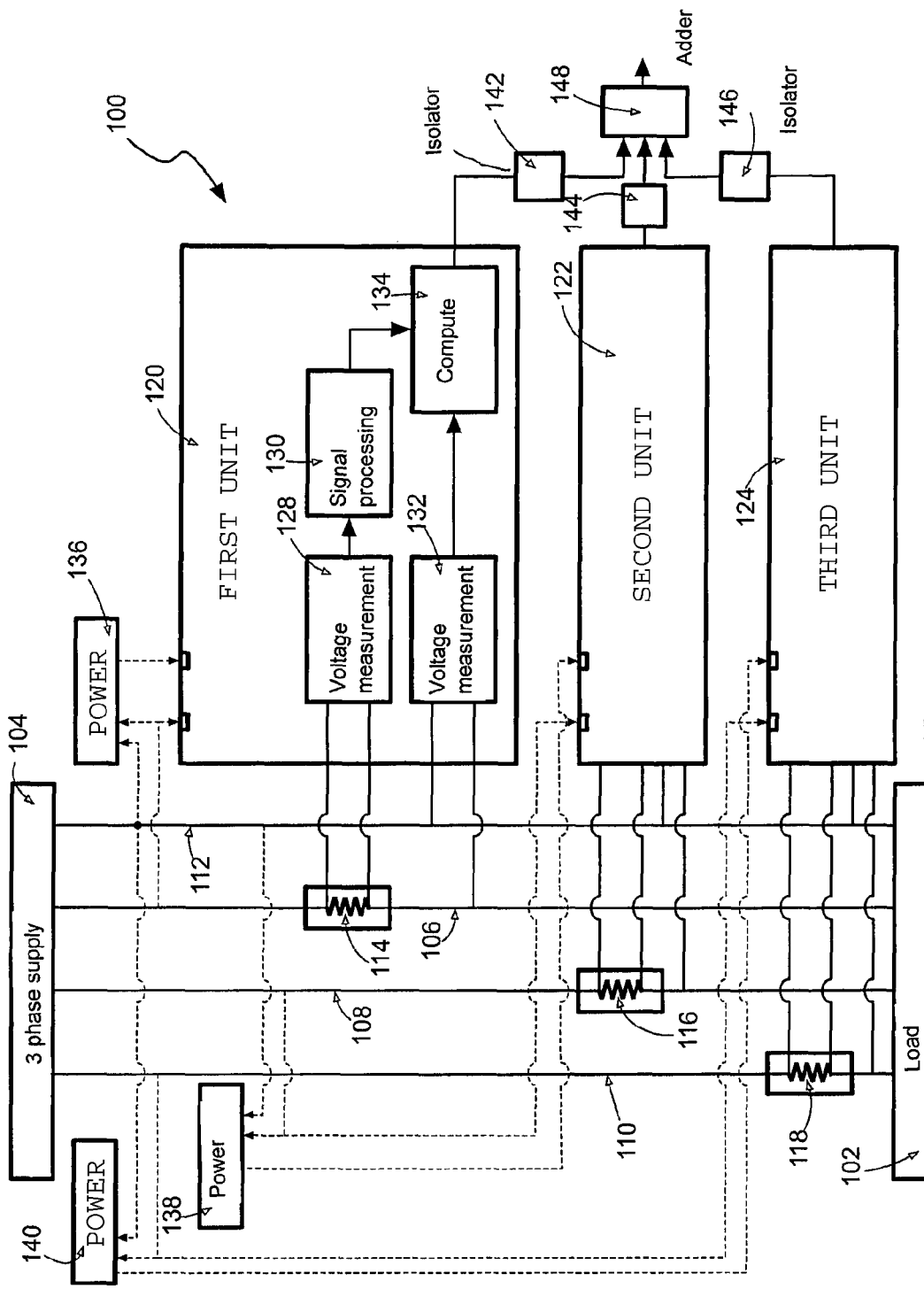
FIG. 3 is a block diagram representation of measuring apparatus for a three phase electricity supply.

Measuring apparatus 100 for a three phase electricity supply is shown in FIG. 3. A load 102 draws current from a three phase electricity supply 104 by way of first to third live wires 106, 108, 110 and a neutral wire 112. First to third shunt resistors 114, 116, 118 are present in a respective one of the first to third live wires 106, 108, 110. First to third units 120, 122, 124 measure current and line voltage in or on a respective one of the first to third live wires 106, 108, 110 as described above with reference to FIG. 1. More specifically each unit comprises voltage measuring apparatus 128 and signal processing circuitry 130, which are operative as described above with reference to FIG. 1. Each unit further comprises line voltage measurement apparatus 132, which is operative to measure the voltage between a live wire and a neutral wire as described above with reference to FIG. 1, and multiplication circuitry 134, which is operative to multiply measured current and voltage to determine power. The measuring apparatus 100 further comprises first to third power supply apparatus 136, 138, 140 which are operative to provide electrical power to a respective one of the first to third units 120, 122, 124. Each power supply apparatus draws power from live and neutral wires on the power supply side of the shunt resistors so as to avoid the current measurement apparatus measuring current drawn by the power supply apparatus. In accordance with known design practice, the power supply apparatus provide for ac-dc conversion, rectification, regulation and whatever dc to dc conversion might be required by the first to third units 120, 122, 124. In addition the measuring apparatus 100 comprises first to third galvanic isolators 142, 144, 146 and adder circuitry 148. The first to third galvanic isolators 142, 144, 146 are present in a respective one of the three signal paths between each of the first to third units 120, 122, 124 and the adder circuitry 148 and thereby maintain isolation between and amongst the first to third units. The adder circuitry 148 is operative to receive an output from the multiplication circuitry 134 of each of the first to third units 120, 122, 124 to add the outputs and thereby determine power for all three phases. Although not shown in FIG. 3, in a form of the measuring apparatus a fourth shunt resistor is provided in the neutral wire 112 and the apparatus further comprises further current measurement apparatus of a form already described. The measuring apparatus is further configured to compare current measured for the neutral wire with the sum of the currents measured in the three live wires to provide for tamper detection. The configuration shown in FIG. 3 is applied to a split phase arrangement by dispensing with one of the first to third shunt resistors 114, 116, 118 and its associated circuitry whereby current and line voltage is measured in two phases only. The configuration shown in FIG. 3 is applied to arrangements having four or more phases by providing a respective number of power measurement apparatus 10 as shown in FIG. 1 and associated circuitry of the form shown in FIG. 3.

Voltage measurement apparatus 200 comprised in the power measurement apparatus 10, 50 of FIGS. 1 and 2 and the measuring apparatus of FIG. 3 and according to a first embodiment is shown in FIG. 4A. The voltage measurement apparatus 200 comprises an alternating current power source 202 to which a load 204 is connected by way of a live conductor 206 and a neutral conductor 208. A potential divider (which constitutes a potential attenuator) is connected between the live and neutral conductors. The potential divider comprises a first resistor 210 in series with a second resistor 212 and a first switch 214. The potential divider also comprises a third resistor 216 in series with a second switch 218, the third resistor 216 and the second switch 218 being connected in parallel with the second resistor 212 and the first switch 214. The first and second switches operate out of phase with each other whereby only one of the second and third resistors is connected. The second and third resistors 212, 216 and the first and second switches 214, 218 together constitute a reference impedance arrangement 219. The voltage measurement apparatus 200 further comprises voltage digitisation circuitry 220 (which constitutes a voltage measuring arrangement), which is connected across the parallel combination of first resistor 212 and first switch 214 and second resistor 216 and second switch 218. The voltage digitisation circuitry 220 is operative to sample the voltage across the parallel combination and therefore comprises signal conditioning and analogue to digital conversion circuitry of the same form as used for acquiring voltage signals from across a shunt resistor. The voltage measurement apparatus 200 also comprises an AC measurement circuit 221, a resistor divider calibration calculator and controller 222 and a correction application 223 (which together with the voltage digitisation circuitry all constitute a processing arrangement). The processing arrangement further comprises a digital high pass filter (not shown) which is operative to pass sampled voltage data of a frequency greater than 1 Hz. The digital high pass filter is therefore operative to reduce any offset error, e.g. as may be caused by the analogue to digital converter. The voltage measurement apparatus 200 further comprises a look up table 224, non volatile memory 226, a temperature sensor 228 and a correction store 230. The components of the voltage measurement apparatus 200 with the exception of the first resistor 210 are comprised in an integrated circuit. The first resistor 210 is constituted as an external component. The first resistor 210 has a resistance of 10 MΩ, the second resistor 212 has a resistance of 10 kΩ and the third resistor 216 has a resistance of 5 kΩ. Ordinarily and as will become apparent from the following description the potential divider is operative with the first and second resistors whereby the voltage at the input to the voltage digitisation circuitry 220 is of an appropriate level for measurement by an integrated circuit. The appropriate level needs to take account of any protection devices that might be present on an integrated circuit forming part of the voltage measurement apparatus, for example the protection diode 211 shown in FIG. 4A. If the protection diode 211 turns on even partially it will alter the accuracy of the potential division. The values of the first, second and third resistors 210, 212 and 216 are such that the voltage swing is a maximum of +/−340 mV when the line voltage is around 680V peak to peak, with the value of +/−340 mV being below the typical 0.6V turn on voltage of the protection diode 211. The resistances of the second and third resistors are known to a required accuracy with the resistances being determined by way of measurement using a calibration standard over a range of operating temperatures. The resistances of the second and third resistors are stored in the non volatile memory 226 and the determined temperature profiles are stored in the look up table 224 for subsequent use.

As can be seen from the waveform traces in FIG. 4A the frequency of operation of the switches is lower than the line frequency of the alternating current power source 202 such that the voltage signal present between the live and neutral conductors undergoes several cycles when each of the first and second switches are closed. Furthermore the first and second switches 214, 218 are operative to open and close as close as possible to the zero-crossing point of the voltage signal. The signal processing circuitry of the voltage measurement apparatus 200 is operative to determine the zero crossing point by extraction from the digital waveform data acquired by the analogue to digital converter of the voltage digitisation circuitry 220. The resistance of the first resistor 210 is known to insufficient accuracy or has been subject to drift from a value known previously to sufficient accuracy. The voltage measurement apparatus 200 is therefore operative as follows to determine the resistance of the first resistor to sufficient accuracy. As a first step the resistor divider calibration calculator and controller 222 is operative to close the first switch 214 and open the second switch 218. The voltage digitisation circuitry 220 is then operative to sample the voltage developed across the second resistor 212 to provide a first sampled voltage. Thereafter the resistor divider calibration calculator and controller 222 is operative to open the first switch 214 and close the second switch 218 whereby the second resistor 212 is disconnected and the third resistor 216 is connected. The voltage digitisation circuitry 220 is then operative to sample the voltage developed across the third resistor 216 to provide a second sampled voltage. The AC measurement circuit 221 is operative to determine a voltage value for each of the voltages developed across the second and third resistors, i.e. first and second voltage values, from a respective one of the first and second sampled voltages. The first and second voltage values are RMS voltage values hence the AC measurement circuit 221 is operative to determine an RMS voltage value, which is locked to the line frequency, based on a sampled voltage. Alternatively the first and second voltage values are peak voltage values. The AC measurement circuit 221 is therefore operative according to this alternative approach to perform peak detection on a sampled voltage to determine a peak voltage value. The resistor divider calibration calculator and controller 222 is then operative to determine the resistance of the first resistor 210 as a function of the first and second voltage values and the resistances for the second and third resistors 212, 216, which are recovered from storage in the non volatile memory 226. The accurately known resistances of the second and third resistors 212, 216 and accurate measurement of voltages developed across the second and third resistors provides for accurate determination of the resistance of the first resistor. The resistor divider calibration calculator and controller 222 are also operative to compensate for temperature on the basis of readings from the temperature sensor 228 and the temperature profile stored in the look-up table 224. The resistor divider calibration calculator and controller 222 is then operative to store in the correction store 230 two ratios for the potential divider, a first ratio for when the second resistor is connected and a second ratio for when the third resistor is connected (i.e. [Rint1+Rext]/Rint1 and [Rint2+Rext]/Rint2). Thereafter the resistor divider calibration calculator and controller 222 operate the first and second switches whereby the third resistor 216 is disconnected and the second resistor 212 is reconnected.

In some forms of the embodiment the resistance of the first resistor 210 is determined on a predetermined periodic basis, e.g. once a week or month. In other forms the resistance of the first resistor 210 is determined in dependence on receipt of a control signal 234, which is conveyed to the voltage measurement apparatus 200 when it is deemed appropriate to determine the value of the first resistance accurately. Otherwise the voltage measurement apparatus 200 is operative on a continuous basis, i.e. when either the second or third resistor is connected, to measure the line voltage for power consumption determination purposes. More specifically the voltage digitisation circuitry 220 is operative to pass voltage samples, be it samples acquired when the first resistor 212 is connected or samples acquired when the second resistor 216 is connected, to the correction application 223. The correction application 223 is operative to multiply the received voltage samples by one of the first and second ratios. The resistor divider calibration calculator and controller 222 is operative to select the appropriate one of the first and second ratios in dependence on whichever of the second and third resistors is connected. Thus the correction application 223 is operative to provide digital data that corresponds to the line voltage as an output 232. The resistor divider calibration calculator and controller 222 is further operative to store successively determined values for the first resistor 210 in the correction store 230 for the purposes of condition monitoring. The resistor divider calibration calculator and controller 222 are also operative to run a decision based algorithm to determine how the stored values are used. For example the decision based algorithm is operative to compare a change of resistance from one determination to the next with a threshold value and if the threshold value is exceeded to flag a fault condition. As a further example, the decision based algorithm is operative to compare a rate of change in determined resistance with a threshold value and if the threshold is exceeded to indicate an impending failure of the potential divider. In other forms of the present embodiment the second and third resistors 212, 216 are switched at a faster rate than the line voltage frequency, According to another approach, the potential divider of the voltage measurement apparatus 200 of FIG. 4A is operated such that the first 214 and second 218 switches are opened at the same time whereby the potential divider is inoperative and the line voltage itself is seen by the voltage digitisation circuitry 220. The line voltage acquired when the first 214 and second 218 switches are open is compared with the line voltage as determined during operation of the potential divider and as described above whereby a calibration factor for the potential divider is determined. The resistor divider calibration calculator and controller 222 is operative to determine when the line voltage as measured by way of the potential divider is swinging between predetermined voltage levels near the zero crossing point, such as between zero and plus 3 volts. When the line voltage is between the predetermined voltage levels the resistor divider calibration calculator and controller 222 generates a control signal which is operative to open both switches whereby the voltage digitisation circuitry 220 acquires the line voltage directly.

Figure 4B:
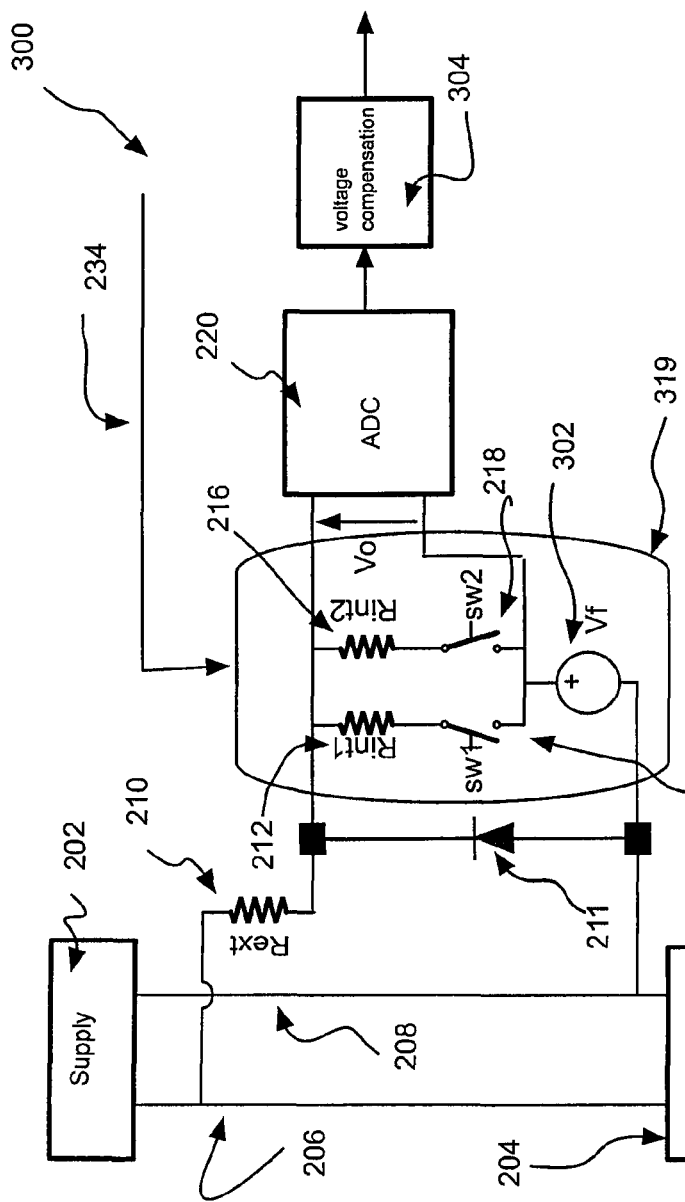
FIG. 4B shows voltage measurement apparatus according to a second embodiment.

Voltage measurement apparatus 300 according to a second embodiment is shown in FIG. 4B. Components of the apparatus of FIG. 4B in common with FIG. 4A are designated with like reference numbers and the reader's attention is directed to the description provided above with reference to FIG. 4A for a description of such common components. The voltage measurement apparatus 300 of FIG. 4B further comprises an offset voltage circuit 302, which is electrically connected between the neutral wire 208 and the ends of the first and second switches 214, 218 opposite the second and third resistors 212, 216. The second and third resistors 212, 216, the first and second switches 214, 218 and the offset voltage circuit 302 together constitute a reference impedance arrangement 319. In addition the voltage measurement apparatus 300 comprises an offset voltage compensation circuit 304 which receives the output from the voltage digitisation circuitry 220 as an input. A protection diode 211 is present on the input of the integrated circuit in which the circuitry of FIG. 4B is comprised. Operation of the voltage measurement apparatus 300 of FIG. 4B will now be described. The voltage measurement apparatus 300 is configured to allow the use of a lower ratio between the first resistor 210 and the second and third resistors 212, 216 so that a larger voltage swing can be handled by the voltage digitization circuitry 220 to create a more accurate measurement. This addresses the clipping in measurement caused by the turning on of protection circuitry, such as the protection diode 211, which are provided at inputs to parts of the voltage measurement apparatus 300 constituted as an integrated circuit (i.e. the circuit components shown in FIG. 4B with the exception of the first resistor 210). The offset voltage circuit 302 is operative to apply an offset voltage, such as one volt, to the neutral wire ends of the first and second switches 214, 218 to thereby reduce the likelihood of the protection circuitry turning on and thereby giving rise to inaccuracy in measurement. The offset voltage compensation circuit 304 is operative on the output from the voltage digitisation circuitry 220 to apply a digital offset which cancels the effect of the offset voltage applied by the offset voltage circuit 302. According to an example where a one volt offset is provided by the offset voltage circuit 302, the second and third resistors 212 and 216 are 40 kOhm and 20 kOhm respectively and the first resistor 210 is 10 MOhm so that the maximum input signal is +/−1360 mV instead of +/−340 mV (as in the example provided in respect of the embodiment shown in FIG. 4A) to thereby improve the error in calculation of the resistance of the first resistor 210 by virtue of the improved resistor ratio.

Figure 4C:
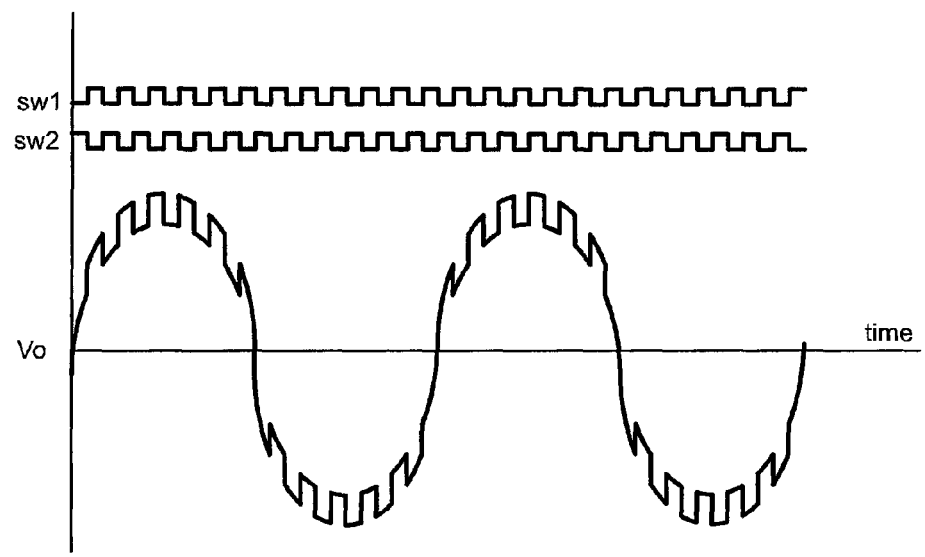
FIG. 4C shows voltage measurement apparatus according to a third embodiment along with signals present in the third embodiment.
Figure 4C:
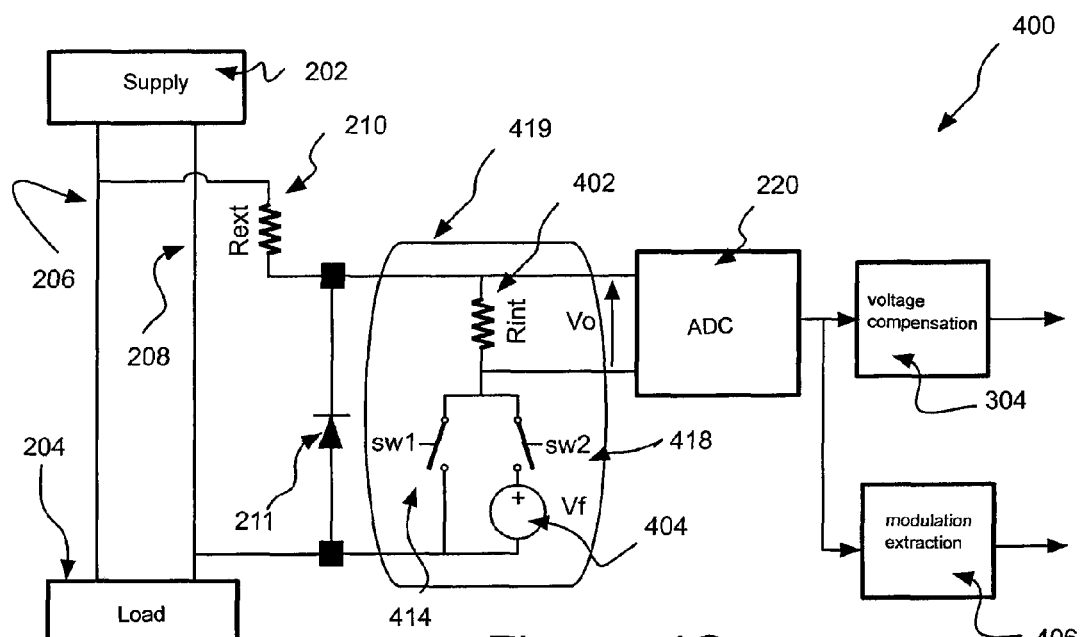

Voltage measurement apparatus 400 according to a third embodiment is shown in FIG. 4C along with signals present in the third embodiment. Components of the apparatus of FIG. 4C in common with FIGS. 4A and 4B are designated with like reference numbers and the reader's attention is directed to the description provided above with reference to FIGS. 4A and 4B for a description of such common components. The voltage measurement apparatus 400 of FIG. 4C comprises an internal resistor 402 instead of the second and third resistors 212, 216 of the apparatus of FIG. 4A. The internal resistor 402 is connected in series with the first resistor 210. The voltage measurement apparatus 400 comprises first and second switches 414, 418. The first switch 414 is connected in series between the internal resistor 402 and the neutral wire 208 and the second switch 418 is connected in series between the internal resistor 402 and an offset voltage circuit 404 such that the first and second switches are disposed in parallel with each other. The offset voltage circuit 404 is connected in series between the second switch 418 and the neutral wire 208. The internal resistor 402 is comprised in an integrated circuit along with the rest of the components of the voltage measurement apparatus 400 with the exception of the first resistor 210, which is an external component. The internal resistor 402, the first and second switches 414, 418 and the offset voltage circuit 404 together constitute a reference impedance arrangement 419. The first resistor 210 has a resistance of 10 MΩ and the internal resistor 402 has a resistance of 20 kΩ. The voltage digitisation circuitry 220 is electrically connected across the internal resistor 402. The voltage measurement apparatus 400 further comprises a modulation extraction circuit 406 which receives an output from the voltage digitisation circuitry 220 as an input. The offset voltage circuit 404 and the two switches 414, 418 are operative provide for modulation between two offset voltage levels, i.e. between 0 volts and 0.5 volts. In an alternative form a second offset voltage circuit is connected in series between the first switch 414 and the neutral wire 208 whereby modulation between two offset voltage levels other than zero volts, e.g. between 0.5 volts and 1.5 volts, is achieved. Although the voltage measurement apparatus 400 of FIG. 4C is configured differently to the voltage measurement apparatus 300 of FIG. 4B the two different configurations are operative to achieve the same effect, i.e. to address inaccuracy in the potential divider and to prevent the protection circuitry turning on when a larger signal is present and otherwise causing measurement inaccuracy. However the voltage measurement apparatus of FIG. 4C is operative to determine the value of the first resistor 210 by calculating the effect of the modulation on the acquired voltage signal. The acquired voltage signal is affected by the modulation current in accordance with Vmod/ (Rext+Rint) (where Vmod is the modulation voltage, Rext is the first resistor 210 and Rint is the internal resistor 402) in a similar way to the embodiment of FIG. 4A in which the acquired voltage signal is altered by switching between the second resistor 212 and the third resistor 216. FIG. 4C shows the two switching signals, which have a frequency higher than the line frequency, and the voltage seen by the voltage digitisation circuitry 220 which shows the measured and modulated line voltage. The value of the first resistor 210 is determined by extracting the modulation and calculating the first resistor value in dependence on the value of the internal resistor 402 and the amount of voltage offset modulation. In common with the approach of FIG. 4A the modulation frequency of the offset voltage circuit 404 is either higher or lower than the line frequency of the alternating current power source 202. Also the offset voltage circuit 404 is operative to modulate the offset voltage in dependence on receipt of a control signal when it is desired to determine the resistance of the first resistor 210 accurately. The control signal 234 is generated by the resistor divider calibration calculator and controller 222 of the apparatus shown in FIG. 4A. Otherwise (i.e. when no accurate determination of the resistance of the first resistor 210 is required) the offset voltage circuit 404 is operative to apply no modulation to the offset voltage whereby the offset voltage circuit 404 is operative in the same fashion as the offset voltage circuit 302 of FIG. 4B. The modulation extraction circuit 406 is operative to extract the modulation from the signal acquired from across the internal resistor 402. Alternatively the modulation signal is extracted in dependence on measuring the current passing though the offset circuit 404. Extraction is by way of frequency or time domain analysis. The voltage measurement apparatus 400 therefore provides two outputs, namely a first modulated signal and a second signal from which the modulation has been removed. A correction application 223 (as shown in FIG. 4A but absent from FIG. 4C) is operative to determine the resistance of the first resistor 210 in dependence on the two outputs. In forms of the invention the second and third embodiments of voltage measurement apparatus are combined with both approaches being used with the combined apparatus being operative to choose one other or both outcomes.

Figure 4D:
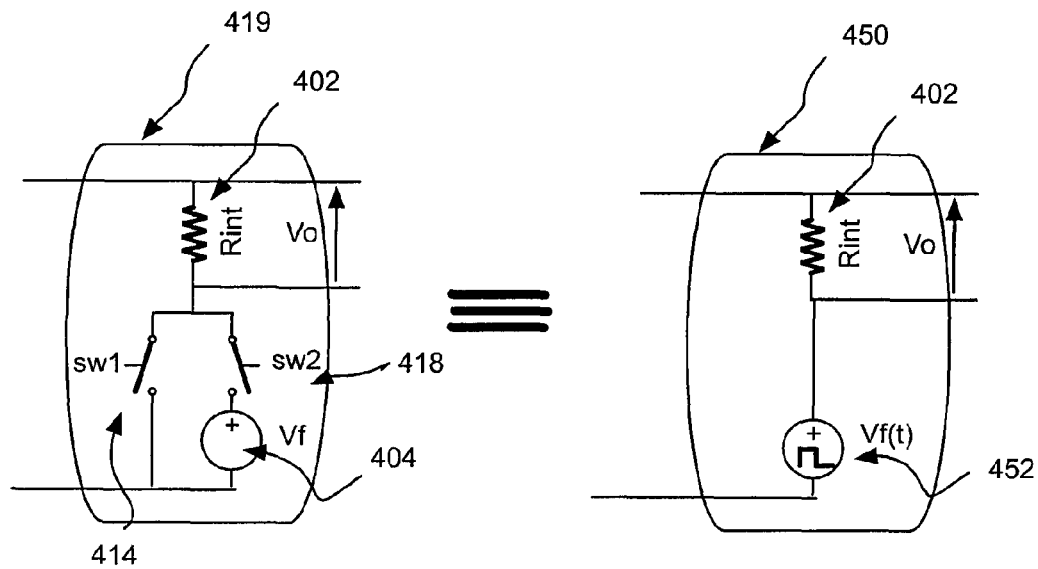
FIG. 4D shows a first form of reference impedance arrangement as an alternative to the reference impedance arrangement shown in FIG. 4C.

A first form of reference impedance arrangement 450 as an alternative to the reference impedance arrangement shown in the third embodiment of FIG. 4C is shown in FIG. 4D. Differences between the first form of reference impedance arrangement 450 of FIG. 4D and the reference impedance arrangement 419 of FIG. 4C will now be described. The first form of reference impedance arrangement 450 comprises a signal generator 452 in series between the internal resistor 402 and the neutral wire instead of the first and second switches 414, 418 and the offset voltage circuit 404. The signal generator 452 is operative to apply a square wave voltage between the internal resistor 402 and the neutral wire to thereby provide for modulation between two offset voltage levels. Otherwise the operation of voltage measurement apparatus comprising the first form of reference impedance arrangement 450 is as described above with reference to FIG. 4C.

Figure 4E:
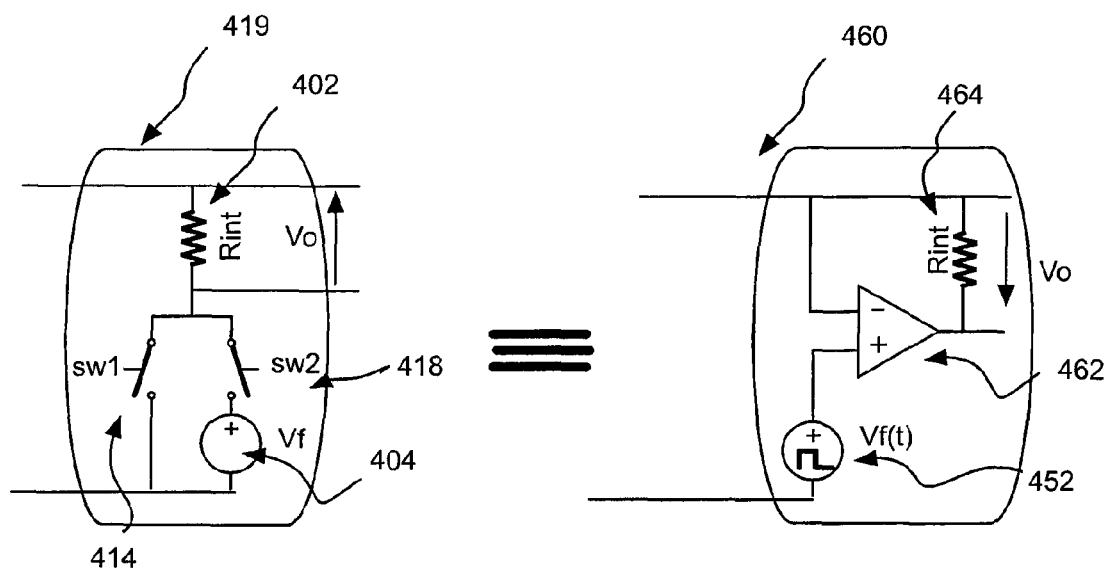
FIG. 4E shows a second form of reference impedance arrangement as an alternative to the reference impedance arrangement shown in FIG. 4C.

A second form of reference impedance arrangement 460 as an alternative to the reference impedance arrangement 419 shown in the third embodiment of FIG. 4C is shown in FIG. 4E. Differences between the second form of reference impedance arrangement 460 of FIG. 4E and the reference impedance arrangement 419 of FIG. 4C will now be described. The second form of reference impedance arrangement 460 comprises an internal resistor 464, an operational amplifier 462 and a signal generator 452. The inverting input of the operational amplifier 462 is connected in series with the first resistor (not shown). The signal generator 452 is connected in series between the non-inverting input of the operational amplifier 462 and the neutral wire. The internal resistor 402 is connected between the output from and the inverting input to the operational amplifier 462 to thereby form an inverting attenuator with the attenuation ratio being determined by the ratio of the value of the internal resistor 464 to the value of the first resistor. The voltage digitisation circuitry (not shown) is operative to measure the voltage signal across the internal resistor 464. In use the signal generator 452 is operative to apply a square wave voltage between the non-inverting input of the operational amplifier 462 the neutral wire to thereby provide for modulation between two offset voltage levels. The voltage digitisation circuitry is operative to measure the voltage signal across the internal resistor 464 which is an attenuated and modulated form of the voltage between the live and neutral wires. Otherwise the operation of voltage measurement apparatus comprising the second form of reference impedance arrangement 460 is as described above with reference to FIG. 4C.

Figure 4F:
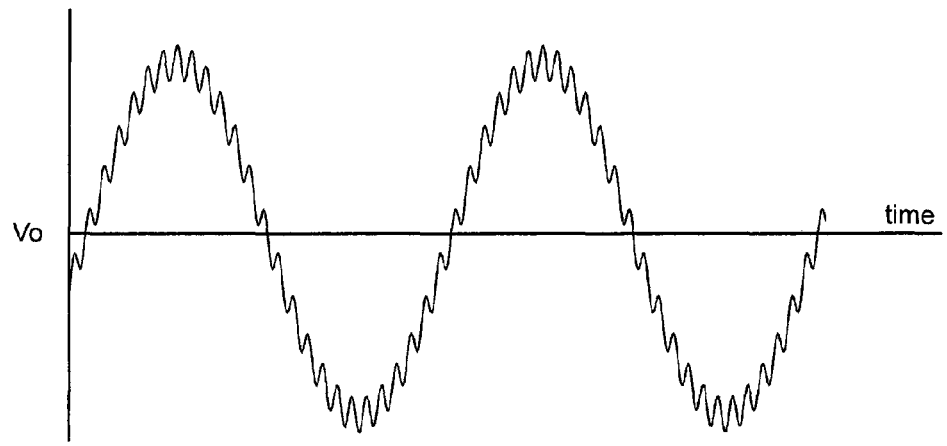
FIG. 4F shows voltage measurement apparatus according to a fourth embodiment.
Figure 4F:
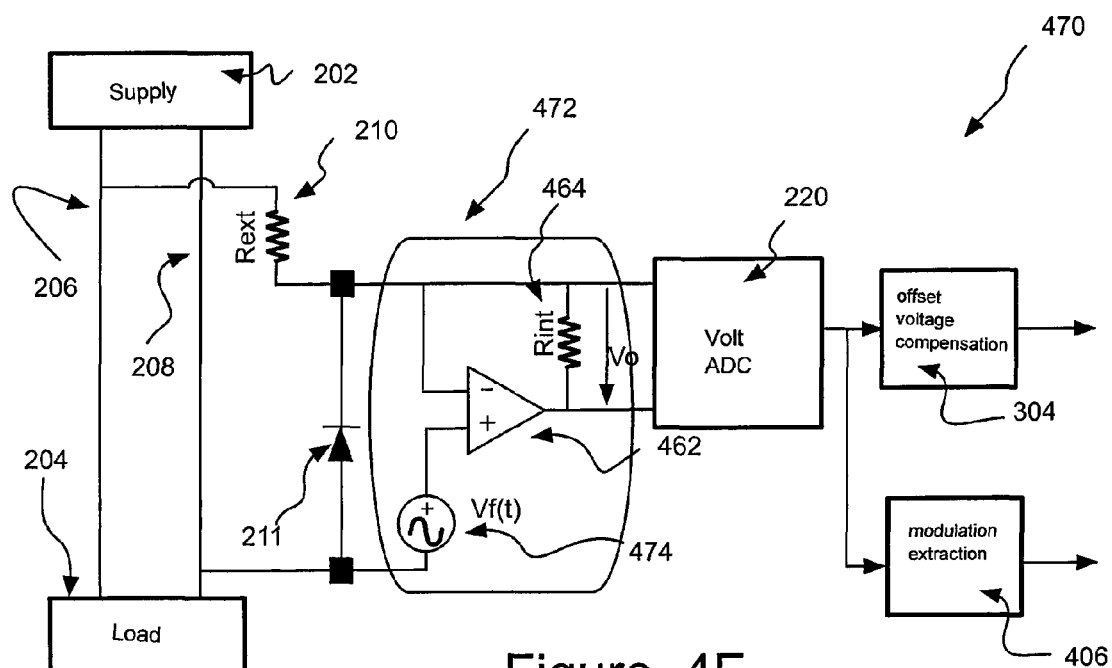

Voltage measurement apparatus 470 according to a fourth embodiment is shown in FIG. 4F along with the voltage signal seen by voltage digitisation circuitry. Components of the apparatus 470 of FIG. 4F in common with FIGS. 4A to 4C are designated with like reference numbers and the reader's attention is directed to the description provided above with reference to FIGS. 4A to 4C for a description of such common components. The voltage measurement apparatus 470 of FIG. 4F comprises a reference impedance arrangement 472 which is the same as described above with reference to FIG. 4E except as follows. The reference impedance arrangement 472 of FIG. 4F comprises a continuous waveform generator 474 instead of the square wave signal generator of FIG. 4E. The continuous waveform generator 474 is operative to generate an offset voltage which has either a simple sinusoidal form or a complex sinusoidal form (i.e. such that it is composed of sinusoids of different frequencies). The continuous waveform generator 474 is therefore operative to modulate the attenuated voltage signal with a sinusoidal signal. The trace in FIG. 4F shows a representative modulated attenuated voltage signal. Otherwise the voltage measurement apparatus 470 of FIG. 4F is as described above. The sinusoidal or complex sinusoidal modulation is extracted from the acquired voltage waveform by means of FFT or other frequency analysis manipulation. A modulation with more than one sine waveform is used to compensate frequency response and/or detect/avoid noise in the acquired signal.

Figure 5A:
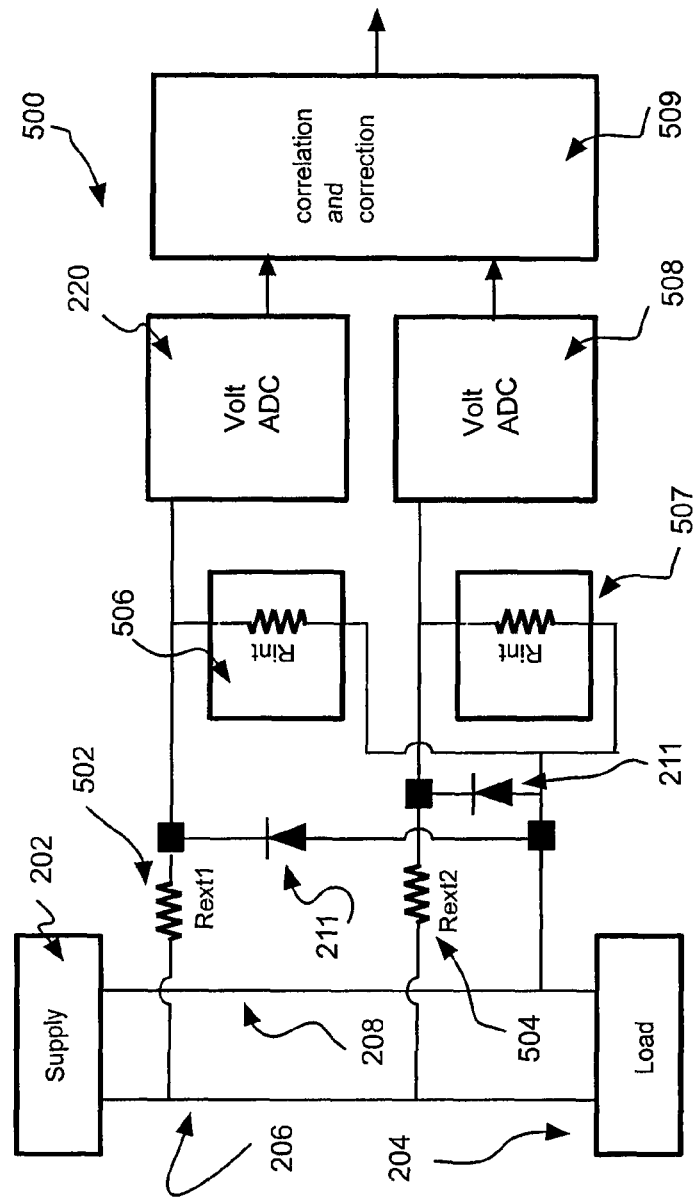
FIG. 5A shows voltage measurement apparatus according to a fifth embodiment.

Voltage measurement apparatus 500 according to a fifth embodiment is shown in FIG. 5A. Components of the apparatus of FIG. 5A in common with FIGS. 4A and 4B are designated with like reference numbers and the reader's attention is directed to the description provided above with reference to FIGS. 4A and 4B for a description of such common components. The voltage measurement apparatus 500 of FIG. 5A comprises a first external resistor 502, a second external resistor 504, a first internal resistor arrangement 506 and a second internal resistor arrangement 507. The voltage measurement apparatus 500 further comprises first voltage digitisation circuitry 220, second voltage digitisation circuitry 508 and subtraction, correlation and correction circuitry 509. The first external resistor 502 and the first internal resistor arrangement 506 are connected in series across the live and neutral wires 206, 208. The first voltage digitisation circuitry 220 is connected across the first internal resistor arrangement 506 and provides a first output to the subtraction, correlation and correction circuitry 509. The second external resistor 504 and the second internal resistor arrangement 507 are also connected in series across the live and neutral wires 206, 208. The second voltage digitisation circuitry 508 is connected across the second internal resistor arrangement 507 and provides a second output to the subtraction, correlation and correction circuitry 509. The first and second internal resistor arrangements 506, 507 are operative to provide for different forms of modulation. According to a first approach each of the first and second internal resistor arrangements 506, 507 has the same form as the arrangement of second and third resistors 212, 216 and first and second switches 214, 218 shown in the embodiment of FIG. 4A. According to this approach the first and second internal resistor arrangements 506, 507 are modulated at different frequencies. Whatever noise is common to both of the first and second outputs from the first and second voltage digitisation circuitry 220, 508 is removed by a subtraction operation performed by the subtraction, correlation and correction circuitry 509 before the resistance of the first and second external resistors 502, 504 is determined. According to a second approach one of the first and second internal resistor arrangements 506, 507 has the same form as the arrangement of FIG. 4C in respect of the single internal resistor 402 and the offset voltage circuit 404. According to this approach one of the offset voltage circuits in the first and second internal resistor arrangements 506, 507 is operative to modulate between two different voltage levels, for example, between 0 volts and 1 volt. Again whatever noise is common to both of the first and second outputs from the first and second voltage digitisation circuitry 220, 508 is removed by a subtraction operation performed by the subtraction, correlation and correction circuitry 509 before the resistance of the first and second external resistors 502, 504 is determined. Otherwise the subtraction, correlation and correction circuitry 509 is operative to correlate the first and second outputs to provide for their proper alignment and to determine a correction factor for the first and second external resistors 502, 504 following determination of the resistance of the first and second external resistors 502, 504. In another form of this embodiment the voltage measurement apparatus 500 is configured to chop between the processing chains of the first and second external resistors 502, 504 to thereby address any error inducing offsets present in the processing chains. More specifically the two processing chains are switched over such that the first and second voltage digitisation circuitry 220, 508 are switched between the first and second internal resistor arrangements 506, 507. In another form of this embodiment the voltage digitization circuitry 220, 508 have at least one component in common, e.g. a shared, time multiplexed analogue to digital converter but different programmable gain amplifiers and sample and hold circuitry. In yet another form of this embodiment the subtraction, correlation and correction factor operations are partially performed in the analogue domain. Either one or a combination of both attenuator circuits is used for the acquisition of the voltage measurement once the attenuation factor is determined for each attenuator by extracting the modulation signal using the combination of both paths to remove the background signal. The embodiment of FIG. 5A can be combined with at least one of the embodiments shown in FIGS. 4A to 4E.

Figure 5B:
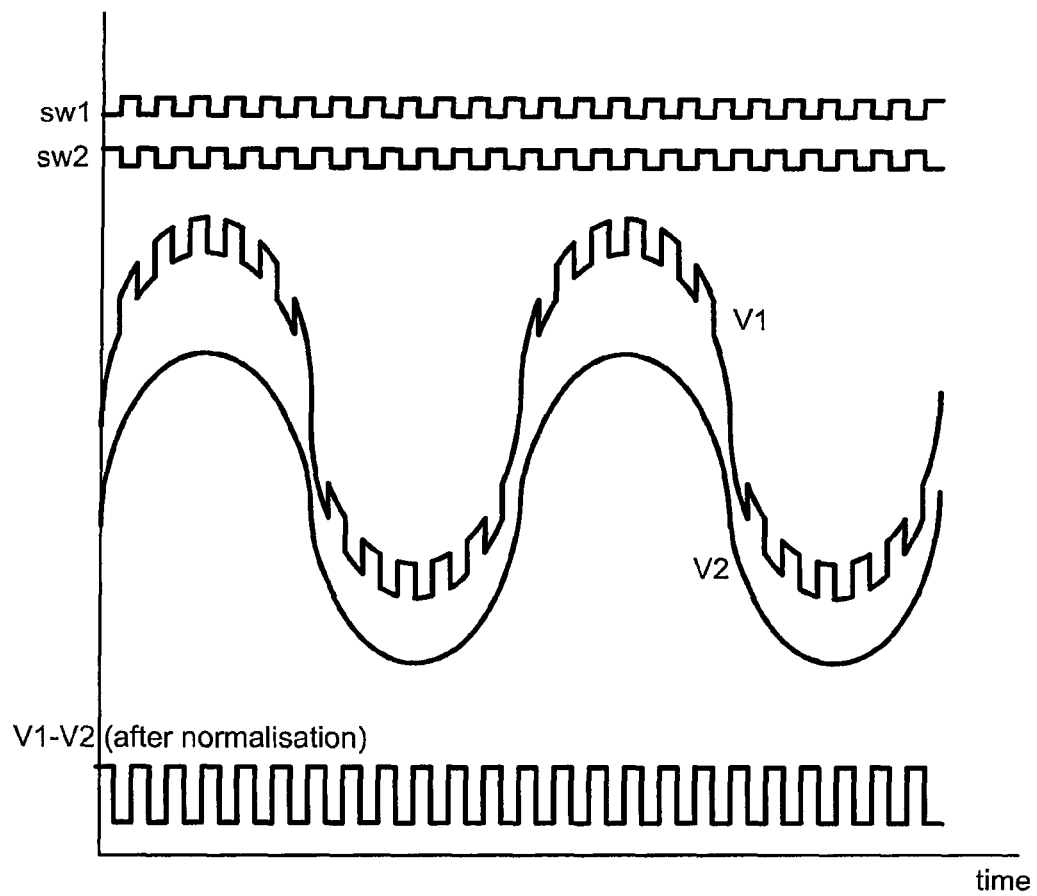
FIG. 5B shows voltage measurement apparatus according to a sixth embodiment along with signals present in the sixth embodiment.
Figure 5B:
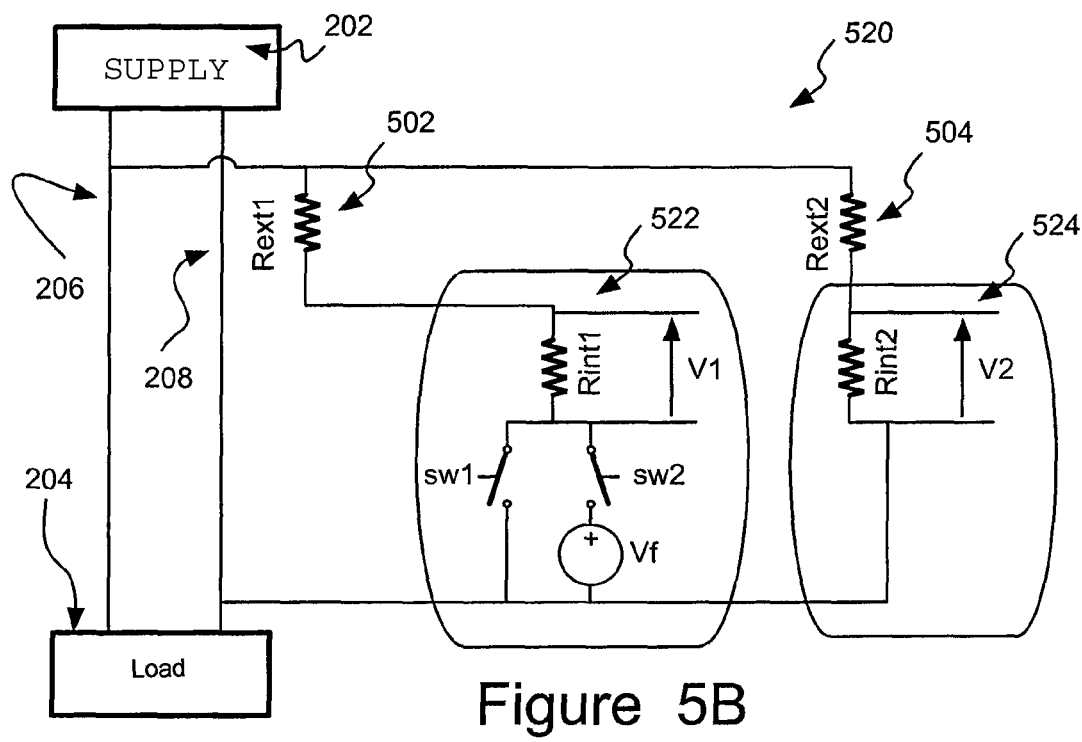

Voltage measurement apparatus 520 according to a sixth embodiment is shown in FIG. 5B along with signals present in the sixth embodiment. The voltage measurement apparatus 520 of FIG. 5B shows a form of the dual reference impedance arrangement of the embodiment of FIG. 5A. Components of the apparatus of FIG. 5B in common with FIG. 5A are designated with like reference numbers and the reader's attention is directed to the description provided above with reference to FIG. 5A for a description of such common components. The voltage measurement apparatus 520 of FIG. 5A comprises a first reference impedance arrangement 522 corresponding to the reference impedance arrangement 419 of the embodiment of FIG. 4C in the place of the first internal resistor arrangement 506 of the embodiment of FIG. 5A. The first reference impedance arrangement 522 comprises an internal resistor in series with a parallel pair of switches and with an offset voltage circuit in series with one of the switches. The voltage measurement apparatus 520 of FIG. 5B further comprises a second reference impedance arrangement 524 in the place of the second internal resistor arrangement 507 of the embodiment of FIG. 5A. The second reference impedance arrangement 524 consists of an internal resistor whereby the second reference impedance arrangement 524 is un-modulated. Although not shown in FIG. 5B the voltage measurement apparatus 520 also comprises first voltage digitisation circuitry which is operative to measure the voltage signal developed across the internal resistor of the first reference impedance arrangement 522 and second voltage digitisation circuitry which is operative to measure the voltage signal developed across the internal resistor of the second reference impedance arrangement 524. As described above with reference to FIG. 5A outputs from the first and second voltage digitisation circuitry are processed by subtraction, correlation and correction circuitry. As can be seen from the graph in FIG. 5B, the operation of the pair of switches in the first reference impedance arrangement 522 modulate the voltage signal V1 seen by the first voltage digitisation circuitry. The pair of switches is operative at a higher frequency than the line voltage whereby the voltage signal V1 is of sinusoidal form with a higher frequency modulation. In view of the second reference impedance arrangement 524 being un-modulated the voltage signal V2 seen by the second voltage digitisation circuitry is an un-modulated sinusoid at the line voltage frequency. Processing by the subtraction, correlation and correction circuitry aligns and normalises the two voltage signals V1, V2 as acquired by their respective voltage digitisation circuitry before subtracting the two voltage signals V1, V2 from each other to remove whatever noise is common to both of the two voltage signals V1, V2.

Figure 5C:
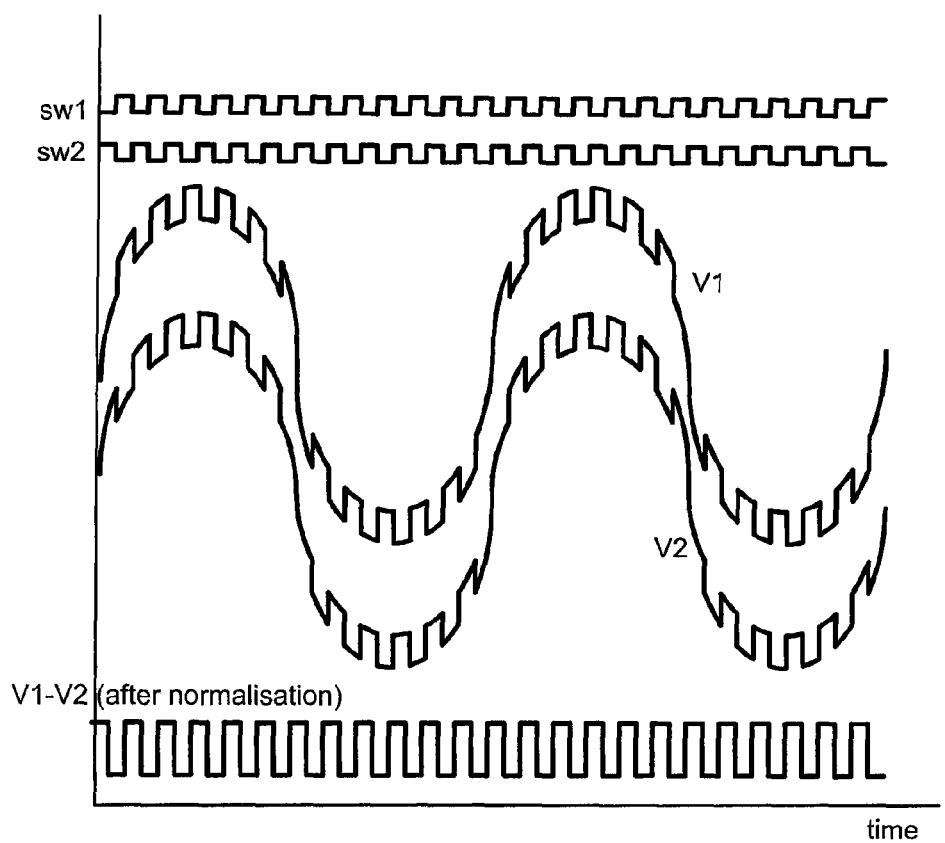
FIG. 5C shows voltage measurement apparatus according to a seventh embodiment along with signals present in the seventh embodiment.
Figure 5C:
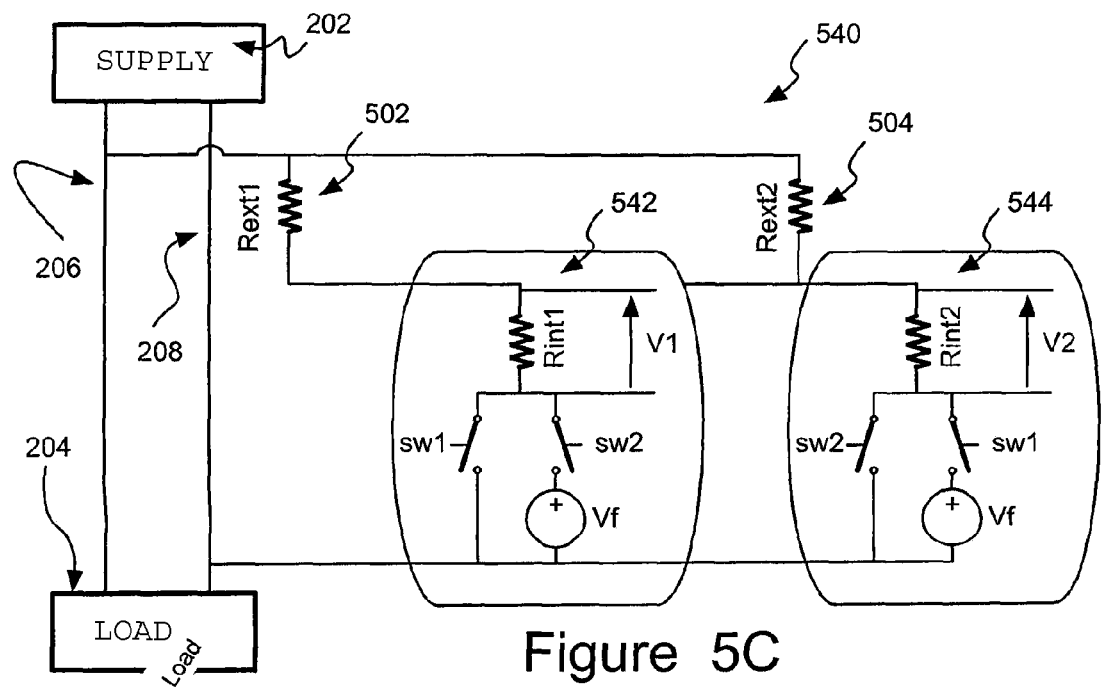

Voltage measurement apparatus 540 according to a seventh embodiment is shown in FIG. 5C along with signals present in the seventh embodiment. The voltage measurement apparatus 540 of FIG. 5C shows another form of the dual reference impedance arrangement of the embodiment of FIG. 5B. Components of the apparatus of FIG. 5C in common with FIGS. 5A and 5B are designated with like reference numbers and the reader's attention is directed to the description provided above with reference to FIGS. 5A and 5B for a description of such common components. Differences between the embodiments of FIGS. 5B and 5C will now be described. The first reference impedance arrangement 542 of FIG. 5C is of the same form and function as the first reference impedance arrangement 522 of FIG. 5B. The second reference impedance arrangement 544 of FIG. 5C is also of the same form and function as the first reference impedance arrangement 522 of FIG. 5B. Thus both of the first and second reference impedance arrangements 542, 544 of FIG. 5C are operative to provide for modulation. The graph in FIG. 5C shows the effect of the dual modulation approach in which each of the two voltage signals V1, V2 as acquired by their respective voltage digitisation circuitry is of sinusoidal form with a higher frequency modulation. Otherwise the voltage measurement apparatus 540 of FIG. 5C is operative as described above with respect to FIG. 5B to subtract the acquired two voltage signals V1, V2 from each other whereby whatever noise that is common to both of the two voltage signals V1, V2 is removed.

Figure 6A:
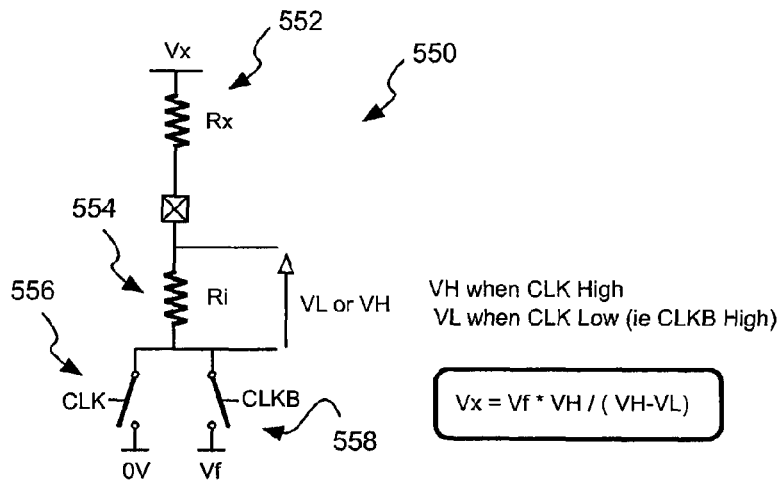
FIG. 6A shows a single switched potential divider arrangement with a circuit equation.

A single switched potential divider arrangement 550 with a circuit equation is shown in FIG. 6A. The single switched potential divider arrangement 550 corresponds to the reference impedance arrangement 419 shown in the third embodiment of FIG. 4C. More specifically the single switched potential divider arrangement 550 comprises an external resistor 552 in series with an internal resistor 554. The single switched potential divider arrangement 550 further comprises first and second switches 556, 558 which are in parallel with each other. The first switch 556 is in series between the internal resistor 554 and the neutral wire. The second switch 558 is in series between the internal resistor 554 and offset voltage circuit. The offset voltage circuit is in series between the second switch 558 and the neutral wire and applies an offset voltage Vf to the second switch 558. The voltage signal developed across the internal resistor 554 is measured as described above. The two switches are clocked in anti-phase. When the first switch is closed and the second switch is open a voltage signal VH is seen across the internal resistor 554. When the second switch is closed and the first switch is open a voltage signal VL is seen across the internal resistor 554. By way of example, a processing arrangement as described elsewhere herein is operative to determine the line voltage, i.e. the voltage between the live and neutral wires in accordance with the equation shown in FIG. 6A. The equation in FIG. 6A is $Vx=Vf*VH/(VH-VL)$, where Vx is the line voltage, Vf is the offset voltage and VH and VL are the measured voltages during different phases of switch clocking. The attenuation factor is then determined and the value of the external resistor 552 is determined if the value of the internal resistor 554 is known.

Figure 6B:
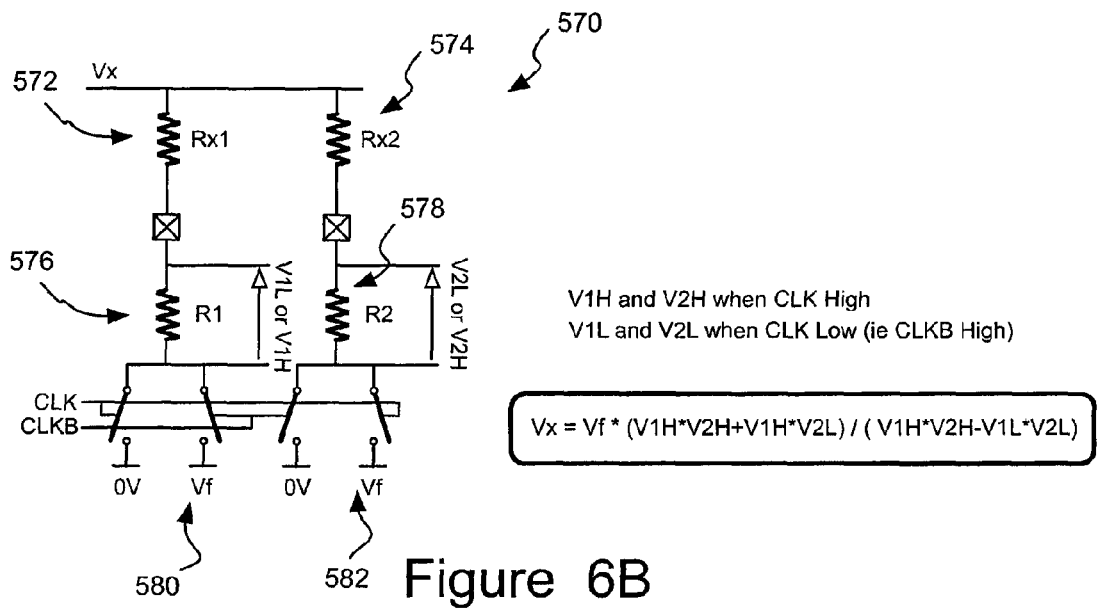
FIG. 6B shows a double switched potential divider arrangement with a circuit equation.

A double switched potential divider arrangement 570 with a circuit equation is shown in FIG. 6B. The double switched potential divider arrangement 570 comprises two switch arrangements of the form shown in FIG. 6A. More specifically the double switched potential divider arrangement 570 comprises a first external resistor 572 in series with a first internal resistor 576 which is in series with a first parallel arrangement of switches 580. The first parallel arrangement of switches 580 comprises an offset voltage circuit which is operative to apply an offset voltage to one of the two switches. The double switched potential divider arrangement 570 further comprises a second external resistor 574 in series with a second internal resistor 578 which is in series with a second parallel arrangement of switches 582. The second parallel arrangement of switches 582 comprises an offset voltage circuit which is operative to apply an offset voltage to one of the two switches. The first and second parallel arrangement of switches 580, 582 are clocked in anti-phase with each other such that, for example, the offset voltage circuit connected switch in the first parallel arrangement of switches 580 is open when the offset voltage circuit connected switch in the second parallel arrangement of switches 582 is closed. The double switched potential divider arrangement 570 is operative such that a voltage signal V1H or V1L is seen across the first internal resistor 576 depending on whether the offset voltage Vf is applied. The double switched potential divider arrangement 570 is also operative such that a voltage signal V2H or V2L is seen across the second internal resistor 578 depending on whether or not the offset voltage Vf is applied. By way of example, a processing arrangement as described elsewhere herein is operative to determine the line voltage, i.e. the voltage between the live and neutral wires in accordance with the equation shown in FIG. 6B. The equation in FIG. 6B is Vx=Vf*(V1H*V2H+V1H*V2L)/(V1H*V2H−V1L*V2L), where Vx is the line voltage, Vf is the offset voltage, V1H and V1L are the measured voltages across the first internal resistor 576 during different phases of switch clocking and V2H and V2L are the measured voltages across the second internal resistor 578 during different phases of switch clocking. The attenuation factors are then determined for each divider. Also the values of the first and second external resistors 572, 574 are determined if the values of the first and second internal resistors 576, 578 are known.

The invention claimed is:

1. Voltage measurement apparatus comprising:
   a potential attenuator configured to be electrically connected between first and second conductors that are coupled to receive a line frequency signal, the potential attenuator comprising a first impedance and a reference impedance arrangement in series with each other, the reference impedance arrangement including a second impedance having an electrical characteristic which is adapted to change in a known fashion; and including a first, offset voltage circuit, configured to provide a modulated offset signal that modulates the received line frequency signal at the second impedance, which is operative to apply an offset between the first and second conductors; and
   a processing arrangement configured to acquire the received line frequency signal and the modulated offset signal from the reference impedance arrangement, the acquired signals reflecting change of the electrical characteristic in the known fashion; and to determine a voltage between the first and second conductors in dependence on the fashion in which the electrical characteristic is changed being known and the acquired signals.

2. Voltage measurement apparatus according to claim 1 in which the processing arrangement is configured to determine an impedance of the first impedance in dependence on the fashion in which electrical characteristic is changed being known and the acquired signals.

3. Voltage measurement apparatus according to claim 2 in which the processing arrangement is further configured:
   to determine an attenuation factor in dependence on the determined impedance of the first impedance; and to determine the voltage between the first and second conductors by applying the attenuation factor to a signal acquired by the processing arrangement.

4. Voltage measurement apparatus according to claim 2 in which the processing arrangement is configured to compare a change in impedance of the first impedance from one determination to another with a threshold value.

5. Voltage measurement apparatus according to claim 1 in which the offset voltage circuit which is operative to apply a compensation signal to an acquired signal to cancel an effect of the offset voltage applied before acquisition.

6. Voltage measurement apparatus according to claim 1 in which the reference impedance arrangement is operative to apply at least one offset voltage between the second impedance and one of the first and second conductors.

7. Voltage measurement apparatus according to claim 1 in which the potential attenuator is configured such that the reference impedance arrangement is operative to apply plural offset voltages between the first and second conductors, the plural offset voltages defining a waveform of one of discrete form and continuous form.

8. Voltage measurement apparatus according to claim 1 further comprising a second potential attenuator configured to be electrically connected between the first and second conductors, the second potential attenuator comprising a first impedance and a reference impedance arrangement in series with each other, the reference impedance arrangement having an electrical characteristic which is changeable in a known fashion, the processing arrangement being responsive to the second potential attenuator.

9. Voltage measurement apparatus according to claim 8 in which the voltage measurement apparatus is configured such that the first and second potential attenuators are operative to change their respective electrical characteristic in different known fashions.

10. Voltage measurement apparatus according to claim 8 in which the processing arrangement is operative to subtract signals acquired from one of the first and second potential attenuators from signals acquired from the other of the first and second potential attenuators.

11. Voltage measurement apparatus according to claim 8 in which the processing apparatus is operative to correlate signals acquired from the first and second potential attenuators with each other to thereby align the signals with each other.

12. Voltage measurement apparatus according to claim 1 configured to determine at least one of an ac voltage between the first and second conductors and a dc voltage between the first and second conductors.

13. Voltage measuring apparatus comprising plural voltage measurement apparatus according to claim 1, each of the plural voltage measurement apparatus being configured to measure line voltage between a different pair of wires of the electricity supply.

14. A method of measuring voltage by way of a potential attenuator electrically connected between first and second conductors that are coupled to receive a line frequency signal, the potential attenuator comprising a first impedance and a reference impedance arrangement in series with each other, the reference impedance arrangement including a second impedance having an electrical characteristic which is adapted to change in a known fashion, the method comprising:
- providing a modulated offset signal that modulates the received line frequency signal at the second impedance so as to apply an offset between the first and second conductors;
- acquiring the received line frequency signal and the modulated offset signal from the reference impedance arrangement, the acquired signals reflecting change of the electrical characteristic in the known fashion; and
- determining a voltage between the first and second conductors in dependence on the fashion in which the electrical characteristic is changed being known and the acquired signals.

* * * * *